United States Patent [19]

Shizawa

[11] Patent Number: 5,311,457
[45] Date of Patent: May 10, 1994

[54] DIGITAL FILTER
[75] Inventor: Hiroshi Shizawa, Tokyo, Japan
[73] Assignee: LSI Logic Kabushiki Kaisha, Tokyo, Japan
[21] Appl. No.: 869,377
[22] Filed: Apr. 16, 1992
[30] Foreign Application Priority Data
Apr. 17, 1991 [JP] Japan .................. 3-112423
[51] Int. Cl.⁵ ............................ G06F 15/31
[52] U.S. Cl. .............................. 364/724.13
[58] Field of Search ........... 364/724.13, 724.10, 364/724.16, 724.01; 341/61

[56]     References Cited
       U.S. PATENT DOCUMENTS
4,389,538  6/1983  White ..................... 364/724.13
4,725,972  2/1988  Gockler ................... 364/724.10
4,893,265  1/1990  Hirosaki .................. 364/724.13
4,903,019  2/1990  Ito ....................... 341/61

Primary Examiner—Long T. Nguyen
Attorney, Agent, or Firm—Gerald E. Linden

[57] ABSTRACT

A digital filter device is for use in signal processing paths for parallel processing n series of input signals having a common sampling frequency $f_i$ and parallel delivering n series of output signals. Input signals of the n series are sequentially switched for delivery to a single FIR (finite-duration impulse response) filter which is commonly used in a time sharing manner so that the FIR filter is shared by the n series of signals. Use of time shared FIR filter allows for the construction of the digital filter device from a reduced number of elements. Also provided is a sampling frequency conversion apparatus using the digital filter. A MUSE (multiple sub-Nyquist subsampling encoding) decoder uses a single sampling frequency conversion apparatus for both still and motion picture signal processing paths in a time sharing manner.

7 Claims, 15 Drawing Sheets

DIGITAL FILTER

This invention relates to a digital filter device for use in digital signal processing apparatus having a plurality of signal processing paths for processing a plurality of signals having a common sampling frequency. It also relates to an apparatus employing such a digital filter, that is, a sampling frequency converter for converting the sampling frequency of a plurality of signals into a common one different from the input signal sampling frequency as well as a decoder for decoding signals encoded by the MUSE (multiple sub-Nyquist subsampling encoding) system which is a band compression technique applicable to HDTV broadcasting, to be referred to as a MUSE decoder, hereinafter.

BACKGROUND OF THE INVENTION

In unison with the recent start of experimental "hivision" (one form of HDTV developed by NHK) broadcasting in Japan, great efforts have been devoted for the development and improvement of associated equipment toward the future commercial broadcasting. Since the HDTV broadcasting entails a significantly large quantity of information which is more than five times the information quantity used in the current NTSC system of TV broadcasting, the signals involved therein have a so increased band width that it is difficult to transmit the signals with their band width unchanged using a single satellite broadcasting channel. Thus developed was the technique of subsampling the signals in accordance with a predetermined scheme for compression transmission, that is, MUSE system.

The receiver for receiving signals compressed by the MUSE system should have a device for restoring the input signals to the original form of signals, that is, MUSE decoder. The MUSE decoder is to complement subsampled-out data by interpolation between the available data and a change of the sampling frequency. Since signals in still picture regions and signals in motion picture regions, which both belong to video signals, are subject to different sampling modes at the encoder side, the MUSE decoder is designed to distribute the video signals between still and motion picture region signal processing paths where data interpolation and sampling frequency change are separately carried out. For the MUSE decoder, reference is made to "Nikkei Electronics", No. 433, Nov. 2, 1987, pages 189-212, "TV Technology", August 1989, pages 65-73, and Ninomiya, Yuichi, "MUSE - Hivision Transmission System", Dec. 1, 1990, published by Densi Joho Tusin Gakkai.

To illustrate the principle construction of the MUSE decoder, a video signal processing path is shown in FIG. 11. Although video signals include Y or luminance signals and C or color signals, the path for processing Y signals is generally illustrated herein and explanation is made to only Y signals in the following description unless otherwise stated.

In FIG. 11, an A/D converter 1 receives analog signals at the input, picks up data signals having a sampling frequency of 16.2 MHz as MUSE signals from the input signals, and deliver the MUSE signals to a MUSE decoder 2. The MUSE decoder 2 distributes the MUSE signals between a still picture region signal processing path 3 and a motion picture region signal processing path 4 at the same time. The still picture region signal processing path 3 includes an inter-frame interpolation means 5, a sampling frequency conversion means 6, and an inter-field interpolation means 7. The motion picture region signal processing path 4 includes an intra-field interpolation means 8 and a sampling frequency conversion means 9. In the still picture region signal processing path 3, the inter-frame interpolation means 5 serves to interpolate a signal between one field in a frame and one field in another frame, and the signal frequency is consequently changed from 16.2 MHz to twice the original, 32.4 MHz. Upon receipt of signals of 32.4 MHz, the sampling frequency conversion means 6 changes them to signals of 48.6 MHz, which are subject to inter-field interpolation in the inter-field interpolation means 7 for eventually delivering processed still picture signals to a still/motion picture signal mixer means 10. In the motion picture region signal processing path 4, on the other hand, the intra-field interpolation means 8 serves to create data intermediate data having a sampling frequency of 16.2 MHz within the same field through complement from the adjacent data, consequently forming signals of 32.4 MHz. Upon receipt of signals of 32.4 MHz, the sampling frequency conversion means 9 changes them to signals of 48.6 MHz for eventually delivering processed motion picture signals to the still-/motion picture signal mixer means 10. The mixer means 10 is effective for mixing the processed still and motion picture signals under the control of a motion detection means (not shown), regenerating signals for forming an overall image.

The sampling frequency conversion means 6 and 9 of the still and motion picture region signal processing paths 3 and 4 may be constructed each as a digital filter comprising an FIR (finite-duration impulse-response) filter. This will be understood from the following description.

In general, the FIR filter, as seen from FIG. 12 showing its principle, includes delay elements $D_1, D_2, \ldots, D_n$ typically in the form of shift registers, coefficient multiplier means $M_0, M_1, \ldots, M_n$, and an adder means A. Also available is the construction of FIG. 13 which is a modification or re-arrangement of the construction of FIG. 12. When the FIR filter shown in FIG. 12 or 13 is used as the sampling frequency conversion means 6 or 9 in the MUSE decoder, signals having a sampling frequency converted to 48.6 MHz can be derived as the addition output from the adder means A (or $A_1$ through $A_n$) by causing the FIR filter to operate at 97.2 MHz, the least common multiple between the input signal frequency 32.4 MHz and the output signal frequency 48.6 MHz, and determining proper coefficients to be multiplied in the coefficient multiplier means $M_0, M_1, \ldots, M_n$.

It is to be noted that since the frequency conversion means used in the aforementioned MUSE decoder have a specific integral ratio of 2:3 between its input frequency (32.4 MHz) and output frequency (48.6 MHz), the FIR filters used as the frequency conversion means can be reduced in cost by modifying the filters for parallel processing of signals for slowing down the operating speed of the filters. More particularly, since the actual input frequency to the filter operating at 97.2 MHz which is the least common multiple between the input and output signal frequencies is 32.4 MHz which is ⅓ of the filter operating frequency, among data of input signals, two of three data are zero, and since the output frequency is 48.6 MHz which is ½ of the filter operating frequency, no calculation is needed for one of two data. This suggests that an arrangement as generally shown in FIG. 14 can be used as the sampling frequency conversion means in the MUSE decoder.

The sampling frequency conversion means shown in FIG. 14 includes an FIR filter consisting of parallel arranged three gangs of filters $F_1$, $F_2$ and $F_3$. A serial/parallel converter means 11 converts data signals of 32.4 MHz into parallel two successions of signals of 16.2 MHz which are delivered to the three gangs of filters $F_1$, $F_2$ and $F_3$ operating at 16.2 MHz for parallel processing. Outputs of the three gangs of filters $F_1$, $F_2$ and $F_3$ are sequentially selected by a switch means Sa in the form of a multiplexer for providing output signals of 48.6 MHz.

The principle sampling frequency conversion means for the MUSE decoder shown in FIG. 14 is embodied by a circuit arrangement as shown in FIG. 15. The serial/parallel converter means 11 is shown in FIG. 15 as including a shift register 11a operating at 32.4 MHz and shift registers 11b and 11c operating at 16.2 MHz. The three gangs of filters $F_1$, $F_2$ and $F_3$ operating at 16.2 MHz have a common delay element section, but three separate sections of multiplier means and adder means. Signals across delay elements $D_1$, $D_2$, $D_3$ and $D_4$ are delivered at predetermined intervals to three groups of multiplier means $M_{11}$, $M_{12}$, $M_{13}$, $M_{14}$, $M_{15}$; $M_{21}$, $M_{22}$, $M_{23}$, $M_{24}$; and $M_{31}$, $M_{32}$, $M_{33}$, $M_{34}$ where they are multiplied by respective coefficients. Outputs of multiplier means $M_{11}$–$M_{15}$ are added by a first adder means $A_1$, outputs of multiplier means $M_{21}$–$M_{24}$ added by a second adder means $A_2$, and outputs of multiplier means $M_{31}$–$M_{34}$ added by a third adder means $A_3$. Outputs of respective adder means $A_1$, $A_2$ and $A_3$ are sequentially selected by a switch means Sa changing over at 48.6 MHz for providing output signals of 48.6 MHz.

As mentioned above, the MUSE decoder employs for both the still and motion picture region signal processing paths sampling frequency conversion means which can be embodied by digital filters. One most practical embodiment uses sampling frequency conversion means in the form of a digital filter as illustrated in FIG. 15 in each of the still and motion picture region signal processing paths. The sampling frequency conversion means in the form of a digital filter, however, requires many delay elements, many multiplier means and some adder means as understood from FIG. 15. Then the provision of two sampling frequency conversion means inevitably leads to an increased cost.

SUMMARY OF THE INVENTION

Therefore, an object of the present invention is to provide, in connection with a digital signal processing apparatus like a MUSE decoder having a plurality of signal processing paths for processing a plurality of signals having a common sampling frequency, a digital filter for use in each signal processing path which is constructed from a significantly reduced number of elements and thus cost effective. Another object of the present invention is to provide a sampling frequency conversion apparatus and a MUSE decoder using the digital filter.

A first aspect of the present invention relates to a fundamental structure of the digital filter device of the invention and provides a digital filter device for use in signal processing paths for parallel processing different n series of input signals having a common sampling frequency $f_i$ and parallel delivering the n series of processed signals wherein n is an integer of at least 2. The device comprises a first switch means adapted to receive the n series of input signals, a single FIR filter coupled to the first switch means and operable at a frequency which is n times the sampling frequency $f_i$ of input signals, and a second switch means coupled to the output of said FIR filter. The first switch means functions to sequentially switch the n series of input signals in a period of $1/(f_i \times n)$ for delivering the signals of the respective series to said FIR filter. The second switch means functions to sequentially switch the signals from said FIR filter at a frequency $f_i \times n$ for delivering the output signals to n output terminals. Thus the FIR filter performs sequential, time sharing processing of the signals of the n series.

According to a second aspect of the present invention which is a preferred embodiment of the first aspect, the FIR filter includes a delay element group, coefficient multiplier means, and adder means. The delay element group is divided into a plurality of delay element blocks, each said delay element block including n serially connected unit delay elements each having a delay time T of $1/(f_i \times n)$. Coefficient multiplication by said coefficient multiplier means and addition by said adder means are performed on signals at opposite ends of each said delay element block.

A third aspect of the present invention provides a sampling frequency conversion apparatus using the digital filter defined above. The sampling frequency conversion apparatus serves for parallel receiving different n series of input signals having a common sampling frequency $f_i$ wherein n is an integer of at least 2, converting the n series of input signals into the n series of signals having a sampling frequency $f_o$ different from the input signal sampling frequency $f_i$ wherein the ratio $f_i:f_o$ is an integral ratio p:q wherein p and q are relatively prime, and parallel delivering the n series of converted signals. The apparatus comprises a first switch means adapted to receive the n series of input signals, a single FIR filter coupled to the first switch means and operable at a frequency $f_{io} \times n$ which is n times the least common multiple frequency $f_{io}$ ($=f_i \times q = f_o \times p$) between the input signal sampling frequency $f_i$ and the output signal sampling frequency $f_o$, and a second switch means coupled to the output of said FIR filter. The first switch means functions to sequentially switch the n series of input signals at a frequency $f_i \times n$ for delivering the signals of the respective series to said FIR filter. The second switch means functions to sequentially switch the signals from said FIR filter at a frequency $f_o \times n$ for delivering the output signals to n output terminals. Thus the FIR filter performs sequential, time sharing processing of the signals of the n series.

According to a fourth aspect of the present invention which is a preferred embodiment of the third aspect, the FIR filter includes a delay element group, coefficient multiplier means, and adder means. The delay element group being divided into a plurality of delay element blocks, each said delay element block including n serially connected unit delay elements each having a delay time T of $1/(f_{io} \times n)$. Coefficient multiplication by said coefficient multiplier means and addition by said adder means being performed on signals at opposite ends of each said delay element block.

A sampling frequency conversion apparatus according to a fifth aspect of the present invention invention is a simplified embodiment of the apparatus of the third aspect. The sampling frequency conversion apparatus serves for parallel receiving different n series of input signals having a common sampling frequency $f_i$ wherein n is an integer of at least 2, converting the n series of input signals into the n series of signals having a sampling frequency $f_o$ different from the input signal sampling frequency $f_i$ wherein the ratio $f_i:f_o$ is an integral ratio p:q wherein p and q are relatively prime and p≧2, and parallel delivering the n series of converted signals. The apparatus comprises serial/parallel conversion means adapted to receive the n series of input signals, first switch means adapted to receive outputs of said serial/parallel conversion means, a single FIR filter adapted to receive outputs of said first switch means, holding means for temporarily holding outputs of said FIR filter, and second switch means for switching outputs of said holding means. The serial/parallel conversion means convert the input signals of the respective series into p parallel signals. The first switch means changes over at a frequency $f_i$xn/p for sequentially selecting p parallel signals of one series from the n series of signal from the serial/parallel conversion means at an instant, thereby delivering p parallel signals of each of said n series to said FIR filter at the instant. The FIR filter includes q parallel arranged filter series or trains, each filter series operating at the frequency $f_i$xn/p. The holding means holds the output signals of the respective filter series using clocks having a frequency $f_o$/q and a phase shifted by q/($f_o$xn). The second switch means sequentially switches the outputs of each holding means at a frequency $f_o$ for delivering signals having a sampling frequency $f_o$ to n output terminals. In this way, the n series of signals are sequentially frequency converted in a time sharing manner.

A sixth aspect of the present invention is a MUSE decoder using a sampling frequency conversion apparatus in the form of a digital filter. The MUSE decoder for processing image signals in the form of A/D converted MUSE signals comprises a still picture region signal processing path having successive stages of inter-frame interpolation, sampling frequency conversion and inter-field interpolation, a motion picture region signal processing path having successive stages of intra-field interpolation and sampling frequency conversion, and mixer means for mixing signals from said still picture region signal processing path and signals from said motion picture region signal processing path. A single sampling frequency conversion apparatus is commonly used as the sampling frequency conversion stage of said still picture region signal processing path and the sampling frequency conversion stage of said motion picture region signal processing path. The sampling frequency conversion apparatus includes (A) first switch means adapted to receive intermediately processed still picture signals having a sampling frequency fi which have undergone inter-frame interpolation in the still picture region signal processing path and intermediately processed motion picture signals having a sampling frequency $f_i$ which have undergone intra-field interpolation in the motion picture region signal processing path, (B) a single digital filter in the form of an FIR filter operating at a frequency which is twice the least common multiple frequency $f_{io}$ between the sampling frequency $f_i$ before conversion and the sampling frequency $f_o$ after conversion, and (C) second switch means coupled to the digital filter at the output. The first switch means (A) alternately switches the intermediately processed still picture signals and the intermediately processed motion picture signals at a frequency $f_i$x2 for delivering the signals to said digital filter. The second switch means (C) alternately switching output signals of said digital filter at a frequency $f_o$x2 for delivering the signals alternately to still and motion picture signal carrying output terminals. The intermediately processed still picture signals and the intermediately processed motion picture signals are alternately frequency converted in a time sharing manner.

A seventh aspect of the present invention provides a MUSE decoder for processing image signals in the form of A/D converted MUSE signals, comprising a still picture region signal processing path having successive stages of inter-frame interpolation, sampling frequency conversion to a sampling frequency 3/2 times the original and inter-field interpolation, a motion picture region signal processing path having successive stages of intra-field interpolation and sampling frequency conversion to a sampling frequency 3/2 times the original, and mixer means for mixing signals from said still picture region signal processing path and signals from said motion picture region signal processing path. A single sampling frequency conversion apparatus is commonly used as the sampling frequency conversion stage of said still picture region signal processing path and the sampling frequency conversion stage of said motion picture region signal processing path. The sampling frequency conversion apparatus includes (A) two serial/parallel conversion means for converting intermediately processed still picture signals having a sampling frequency $f_i$ which have undergone inter-frame interpolation in the still picture region signal processing path and intermediately processed motion picture signals having a sampling frequency $f_i$ which have undergone intra-field interpolation in the motion picture region signal processing path into parallel signals having a frequency $f_i/2$, respectively, (B) first switch means for switching output signals of said serial/parallel conversion means, (C) an FIR filter coupled to receive outputs of said first switch means, (D) two holding means for temporarily holding outputs of said FIR filter, and (E) second switch means for switching output signals of the respective holding means. The first switch means (B) changes over at the frequency $f_i$ for alternately switching two parallel signals corresponding to the intermediately processed still picture signals and two parallel signals corresponding to the intermediately processed motion picture signals for delivering the signals to said FIR filter. The FIR filter (C) includes parallel arranged three filter series each operating at the frequency $f_i$. The holding means (D) holding the output signals of the respective filter series using clocks having a frequency $f_i/2$ and a phase shifted by $4/f_i$. The second switch means (E) alternately switches the outputs of each holding means at a frequency $f_i$x3/2 for delivering signals having a sampling frequency $3f_i/2$ (=$f_o$) to two output terminals.

An eighth aspect of the invention is a preferred embodiment of the seventh aspect. The FIR filter (C) includes a delay element group having a plurality of delay element sets each consisting of a pair of serially connected unit delay elements each having a delay time T of $1/f_i$, coefficient multiplier means, and adder means. The three filter series share said delay element group, but are separately constructed with respect to said coefficient multiplier means and said adder means.

OPERATION

According to the first aspect of the present invention, where a plurality of different series (n series) of input signals having a common sampling frequency $f_i$ should be passed through a filter for each series, a single, common FIR filter is used as the digital filter. This FIR filter operates at a frequency which is n times the frequency $f_i$ of input signals, the n series of input signals having frequency $f_i$ are sequentially switched at a frequency $f_i \times n$ for delivery to the FIR filter, and output signals of the FIR filter are sequentially switched at the frequency $f_i \times n$ for delivery to n output terminals as filter-passed signals. Therefore, the FIR filter is time-sharingly used for the n series of digital signals. The FIR filter sequentially processes signals of a different series for each duration of $1/(f_i \times n)$.

The digital filter device according to the first aspect is designed to share a single FIR filter for different n series of digital signals, resulting in a reduced number of elements and a cost reduction therewith as compared with the prior art using separate filters for respective series.

The digital filter device according to the second aspect is a preferred embodiment of the first aspect. The device performs coefficient multiplication and addition on signals at opposite ends of each delay element block consisting of n serially connected unit delay elements each having a delay time T of $1/(f_i \times n)$. The FIR filter sequentially receives data of different series from the first switch means in a period of $1/(f_i \times n)$ and the FIR filter itself operates at a frequency of $n \times f_i$. Whenever data of a different series are introduced into the FIR filter series by series, data of a previously selected series are shifted to an adjacent unit delay element. Then signals representative of the data of the same series appear across a delay element block consisting of n unit delay elements at a certain point of time, and the signals across the delay element block are replaced by data of the subsequent series after a period of $1/(f_i \times n)$. Therefore, coefficient multiplication and addition are performed on data of the same series at a certain point of time or timing and thereafter, coefficient multiplication and addition are sequentially performed on data of the subsequent series in a period of $1/(f_i \times n)$. By switching and taking out the output signals at a frequency of $f_i \times n$ or a period of $1/(f_i \times n)$, filter-passed output signals are available independently for the respective series without any interference between the series.

In the digital filter device of the second aspect, among the elements of the FIR filter, the coefficient multiplier means and the adder means are shared by the respective series. The number of elements is accordingly reduced to 1/n of the number of elements required in the prior art.

The digital filter can be utilized as a sampling frequency converter. According to the third aspect, a sampling frequency conversion apparatus capable of time sharing use of a single digital filter (FIR filter) for plural series of signals is defined as an apparatus for converting the sampling frequency of plural (n) series of data signals having a common sampling frequency $f_i$ from $f_i$ to $f_o$ and outputting data signals having a sampling frequency $f_o$ for each series. It is necessary that the ratio of sampling frequency $f_i$ before conversion and sampling frequency $f_o$ after conversion be a predetermined integral ratio of p:q wherein p and q are relatively prime. Input signals of each of the n series of signals are sequentially switched by the first switch means at a frequency $f_i \times n$ for delivery to the FIR filter. The FIR filter operates at a frequency $f_{io} \times n$ ($= f_i \times q \times n = f_o \times p \times n$) which is n times the least common multiple frequency $f_{io}$ ($= f_i \times q = f_o \times p$) between the sampling frequency $f_i$ of input signals and the sampling frequency $f_o$ of output signals. Output signals of the FIR filter are sequentially switched by the second switch means at a frequency $f_o \times n$ for delivery to n output terminals. Signals having the sampling frequency $f_o$ are available from the respective output terminals. The single FIR filter is time-sharingly used for the n series of data signals. The sampling frequency is converted from $f_i$ to $f_o$. Data signals having the sampling frequency of $f_o$ are available independently for the respective series without any interference between the series.

The sampling frequency conversion apparatus according to the fourth aspect is a preferred embodiment of the third aspect having applied thereto substantially the same construction as in the second aspect. The apparatus performs coefficient multiplication and addition on signals at opposite ends of each delay element block consisting of n serially connected unit delay elements each having a delay time T of $1/(f_{io} \times n)$.

The sampling frequency conversion apparatus according to the fifth aspect of the present invention is successful in reducing the number of filter-constituting elements and slowing down the operating speed not only by allowing for time sharing use of the FIR filter for plural series of signals, but also by enabling parallel processing of signals by taking advantage of the fact that the sampling frequency $f_i$ before conversion and the sampling frequency $f_o$ after conversion are in a predetermined integral ratio of p:q wherein p and q are relatively prime and $p \geq 2$.

Where $f_i$ and $f_o$ have an integral ratio of p:q, the sampling frequency conversion apparatus according to the third and fourth aspects require that the FIR filter operate at a frequency $f_{io} \times n$ ($= f_i \times q \times n = f_o \times p \times n$) which is n times the least common multiple frequency $f_{io}$ ($= f_i \times q = f_o \times p$) between $f_i$ and $f_o$. For the FIR filter operating at the frequency $f_i \times q \times n = f_o \times p \times n$, since the input signals to the FIR filter have a frequency $f_i \times n$, among signals supplied to the FIR filter, signals having effective data are one for q signals, the remaining (q−1) signals being zero (0). When viewed form the output side, only one for p signals need be calculated and the remaining (p−1) signals need not be calculated. This is the reason why an architecture for parallel processing as defined in the fifth aspect is possible.

In the sampling frequency conversion apparatus according to the fifth aspect, data signals of each of the n series having a sampling frequency $f_i$ are converted into p parallel signals having a sampling frequency of $f_i/p$, which are, in turn, switched for each series by the first switch means at a frequency of $f_i \times n/p$. The signals having a frequency of $f_i \times n/p$ are delivered from the first switch means to the q filter series or trains of the FIR filter. The frequency of $f_i \times n/p$ at this point corresponds to the greatest common measure between the input sampling frequency $f_i$ and the output sampling frequency $f_o$ multiplied by the number of signal series (n). The filter series which receive signals having a frequency of $f_i \times n/p$ ($= f_o \times n/q$) also operate at the same frequency of $f_i \times n/p$. Output signals having a frequency of $f_o \times n/q$ ($= f_i \times n/p$) taken out of the respective filter series are held with the aid of clocks of frequency $f_o/q$ having a phase shift of $q/(f_o \times n)$ and thereafter, sequentially switched by the second switch means and delivered to n output terminals in a period of $1/f_o$. Finally n series of signals having a frequency of $f_o$ are available.

Since the respective filter series may operate at a frequency of $f_i \times n/p$, which is 1/p of the operation frequency $f_i$xn which is required when no parallel processing is done, less expensive elements having relatively slow operating speed can be used.

The MUSE decoder according to the sixth aspect of the present invention allows for the time sharing use of a single apparatus as the sampling frequency conversion means in the still picture region signal processing path and the sampling frequency conversion means in the motion picture region signal processing path. In general, data signals having undergone inter-frame interpolation in the still picture region signal processing path (i.e., intermediately processed still picture region signals) have a frequency $f_i$ of 32.4 MHz and data signals having undergone intra-field interpolation in the motion picture region signal processing path (i.e., intermediately processed motion picture region signals) also have a frequency $f_i$ of 32.4 MHz. That is, both the data signals have the same frequency. In addition, the sampling frequency conversion means is required to convert these two intermediately processed signals having $f_i$=32.4 MHz into signals having $f_o$=48.6 MHz. Then, a single frequency conversion apparatus using a digital filter as mentioned above can be applied as frequency converter means in the respective signal series in the MUSE decoder and used in a time sharing manner.

The MUSE decoder according to the sixth aspect is obtained by adapting the apparatus of the third aspect as a sampling frequency conversion apparatus. The sampling frequency conversion apparatus used in the MUSE decoder corresponds to the apparatus of the third aspect wherein n=2 because the number of signal series involved is two, a series of intermediately processed still picture signals and a series of intermediately processed motion picture signals. More particularly, the sampling frequency conversion apparatus receives intermediately processed still picture signals and intermediately processed motion picture signals both having a sampling frequency of $f_i$ in parallel, and alternately switches the signals at a frequency of $f_i$x2 for delivering the selected signals to the single FIR filter. The FIR filter operates at a frequency ($f_{io}$x2) which is twice the least common multiple frequency $f_{io}$ between the sampling frequency $f_i$ before conversion and the sampling frequency $f_o$ after conversion. Output signals of the digital filter are alternately distributed between still and motion picture processing output terminals by the second switch means at a frequency of $f_o$x2, providing intermediately processed still and motion picture signals both having a sampling frequency of $f_o$.

The MUSE decoder according to the seventh aspect of the present invention not only allows for the time sharing use of a single sampling frequency conversion apparatus as both the sampling frequency converter means in the still picture region signal processing path and the sampling frequency converter means in the motion picture region signal processing path, but also allows for parallel processing of intermediately processed still and motion picture signals thereby slowing down the operating speed within the circuit by noting that both intermediately processed still and motion picture signals generally have an input frequency $f_i$ of 32.4 MHz and an output frequency $f_o$ of 48.6 MHz before and after conversion through the sampling frequency conversion apparatus, with their ratio p:q being equal to 2:3. Differently state, the MUSE decoder of the seventh aspect is one using the sampling frequency conversion apparatus of the fifth aspect wherein n, p and q are n=2, p=2, and q=3.

More particularly, intermediately processed still and motion picture signals both having a sampling frequency $f_i$ are converted into parallel signals having a frequency of $f_i$/2 and then switched at a frequency of $f_i$ so that the FIR filter receives alternately two parallel signals (frequency $f_i$/2) derived from the intermediately processed still picture signal and two parallel signals (frequency $f_i$/2) derived from the intermediately processed motion picture signal. The FIR filter have three parallel arranged filter series each operating at a frequency of $f_i$. Outputs of the three filter series are provided to each of two holding means in parallel where the signals are held using clocks of frequency $f_i$/2 having a phase shift of 4/$f_i$. Then, three outputs of each holding means are sequentially switched by the second switch means in a period of 2/(3x$f_i$) (=1/$f_o$) and delivered to intermediately processed still and motion picture signal output terminals. Eventually, intermediately processed still and motion picture signals having a frequency $f_o$ (=$f_i$x3/2) are available.

The MUSE decoder according to the eighth aspect of the present invention is a preferred embodiment of the seventh aspect wherein the three filter series time share a single delay element group. The delay element group consists of a plurality of delay element sets each consisting of a pair of serially connected unit delay elements each having a delay time T of 1/$f_i$. The unit delay elements are time-sharingly used for the respective filter series, resulting in a reduced number of elements and a cost reduction therewith.

BRIEF DESCRIPTION OF THE DRAWINGS

The above and other objects, features and advantages of the present invention will be more fully understood by reading the following description taken in conjunction with the accompanying drawings.

DESCRIPTION OF THE PREFERRED EMBODIMENTS

Figure 1:
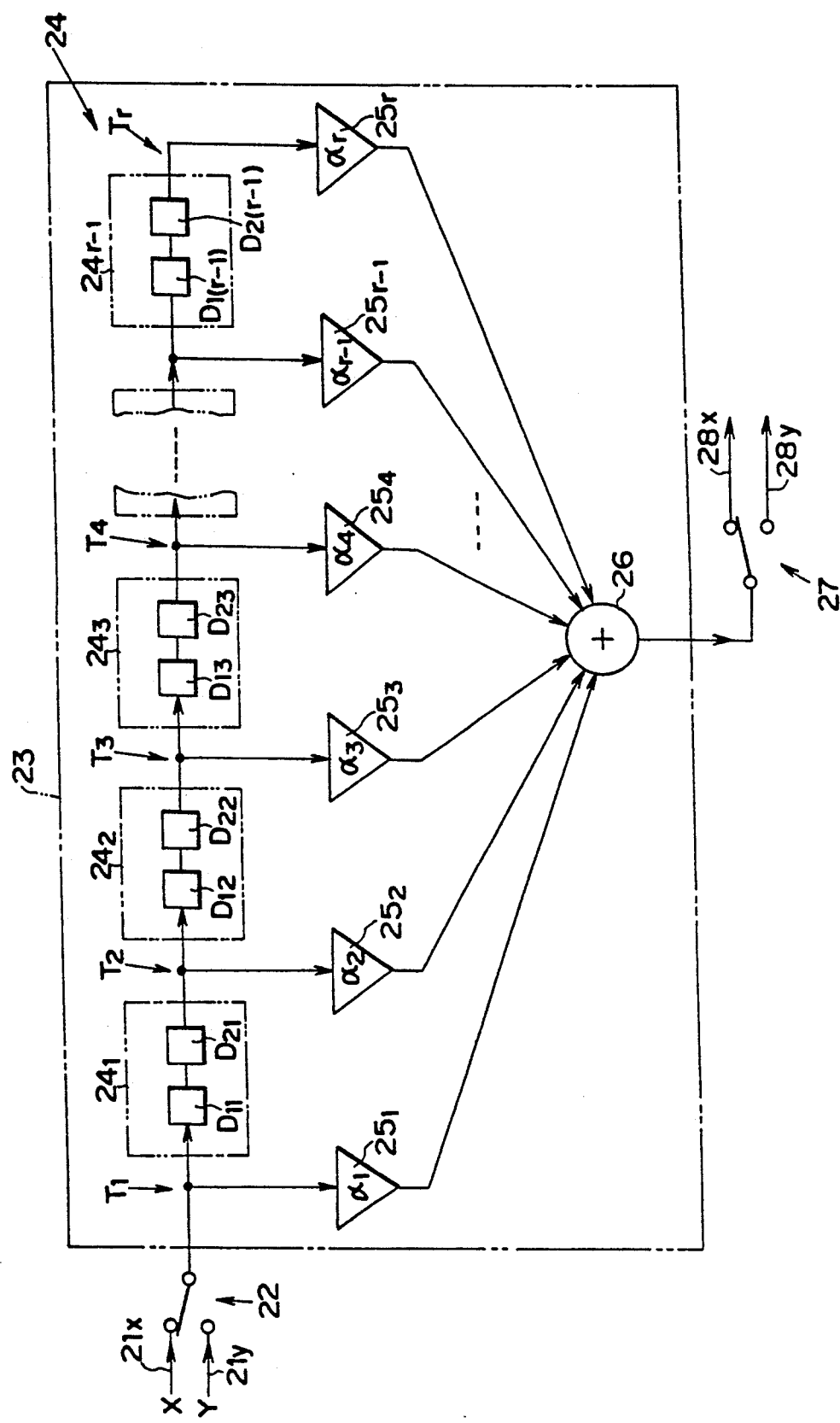
FIG. 1 is a block diagram showing one principle embodiment of the digital filter device according to the present invention.

Referring to FIG. 1, there is illustrated one principle embodiment of the digital filter device according to the present invention which is applied to the processing of two series of signals (n=2).

The digital filter device of FIG. 1 includes two input signal lines $21x$ and $21y$ for receiving two series of input signals X and Y having a common frequency $f_i$. The device also includes a first switch means 22 in the form of a multiplexor connected to input signal lines $21x$ and $21y$ and adapted to change over at a frequency which is two times the input signal frequency $f_i$, that is, $2 \times f_i$ for alternately delivering the two series of input signals X and Y having frequency $f_i$ to an FIR filter 23. The FIR filter 23 is illustrated as comprising a delay element group 24 including a plurality of shift registers, for example, coefficient multiplier means $25_1, 25_2, \ldots, 25_r$ each in the form of a multiplier, and an adder means 26 in the form of an adder.

The delay element group 24 is divided into a plurality of serially connected delay element blocks $24_1, 24_2, \ldots, 24_{r-1}$, each block consisting of two serially connected unit delay elements $D_{1i}$ and $D_{2i}$ (wherein i is from 1 to r−1) having a delay time T equal to $1/(f_i \times 2)$. Taps $T_1$ to $T_r$ are provided across respective delay element blocks $24_1$ to $24_{r-1}$ and connected to coefficient multiplier means $25_1$ to $25_r$ so that signals available at the positions of taps $T_1$ to $T_r$ are multiplied by coefficients $\alpha_1$ to $\alpha_r$, respectively. The coefficient multiplier means $25_1$ to $25_r$ at their output are commonly connected to adder means 26. The output of adder means 26, that is, the output of FIR filter 23 is connected to a second switch means 27 in the form of a de-multiplexor. The second switch means 27 is adapted to operate at frequency $2 \times f_i$ and alternately deliver outputs of adder means 26 (or outputs of FIR filter 23) between two output signal lines $28x$ and $28y$.

The exemplary digital filter device shown in FIG. 1 operates as follows. With two series of signals X and Y having frequency $f_i$ supplied to input signal lines $21x$ and $21y$, first switch means 22 alternately switches the two series of signals X and Y for alternately delivering them to FIR filter 23 as signals having frequency $2 \times f_i$. Then FIR filter 23 alternately receives data of signal series X and data of signal series Y. Since each unit delay element $D_{1i}$, $D_{2i}$ included in FIR filter 23 has a delay time T equal to $1/(f_i \times 2)$ and operates at a frequency $2 \times f_i$, the data are shifted from a unit delay element to the adjacent unit delay element each time when data of signal series X or Y are delivered. Therefore, at a certain timing, data belonging to the same signal series develop at taps $T_1$ to $T_r$ across respective delay element blocks $24_1$ to $24_{r-1}$ each consisting of two serially connected unit delay elements $D_{1i}$ and $D_{2i}$. Differently stated, data belonging to signal series X develop at all taps $T_1$ to $T_r$ at a certain point of time and data belonging to signal series Y develop at all taps $T_1$ to $T_r$ at the next, $1/T$ (i.e., $1/(f_i \times 2)$) later point of time. At a certain point of time, the data of signal series X are subject to coefficient multiplication by the coefficient multiplier means $25_1$ to $25_r$, the results of coefficient multiplication are added by adder means 26, and the result of addition is delivered to second switch means 27. At the next, $1/(f_i \times 2)$ later point of time, the data of signal series Y are subject to coefficient multiplication by the coefficient multiplier means $25_1$ to $25_r$, the results of coefficient multiplication are added by adder means 26, and the result of addition is delivered to second switch means 27. The second switch means 27 alternately switches these signals at frequency $f_i \times 2$ for delivering them to output signal lines $28x$ and $28y$. As a result, filter-passed signals belonging to signal series X appear at output signal line $28x$, and filter-passed signals belonging to signal series Y appear at output signal line $28y$.

Figure 2:
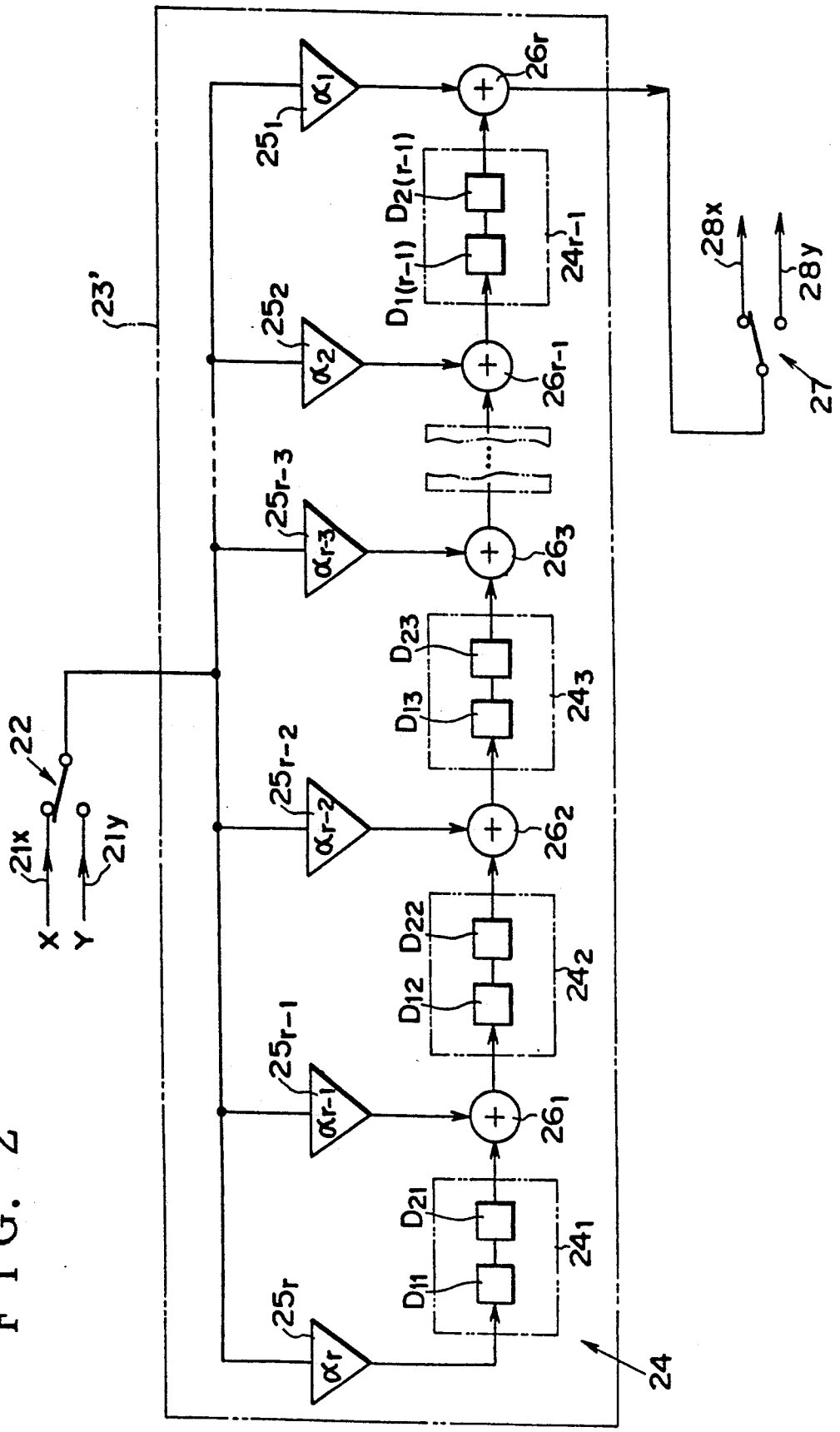
FIG. 2 is a block diagram showing another principle embodiment of the digital filter device according to the present invention.

FIG. 2 illustrates the principle construction of a digital filter device according to another embodiment of the present invention using an FIR filter 23' which is a re arrangement of the FIR filter 23 in the digital filter device of FIG. 1. The essential function of the FIG. 2 construction is the same as that of FIG. 1 except that signals are first subject to coefficient multiplication and thereafter, delayed and added.

Figure 3:
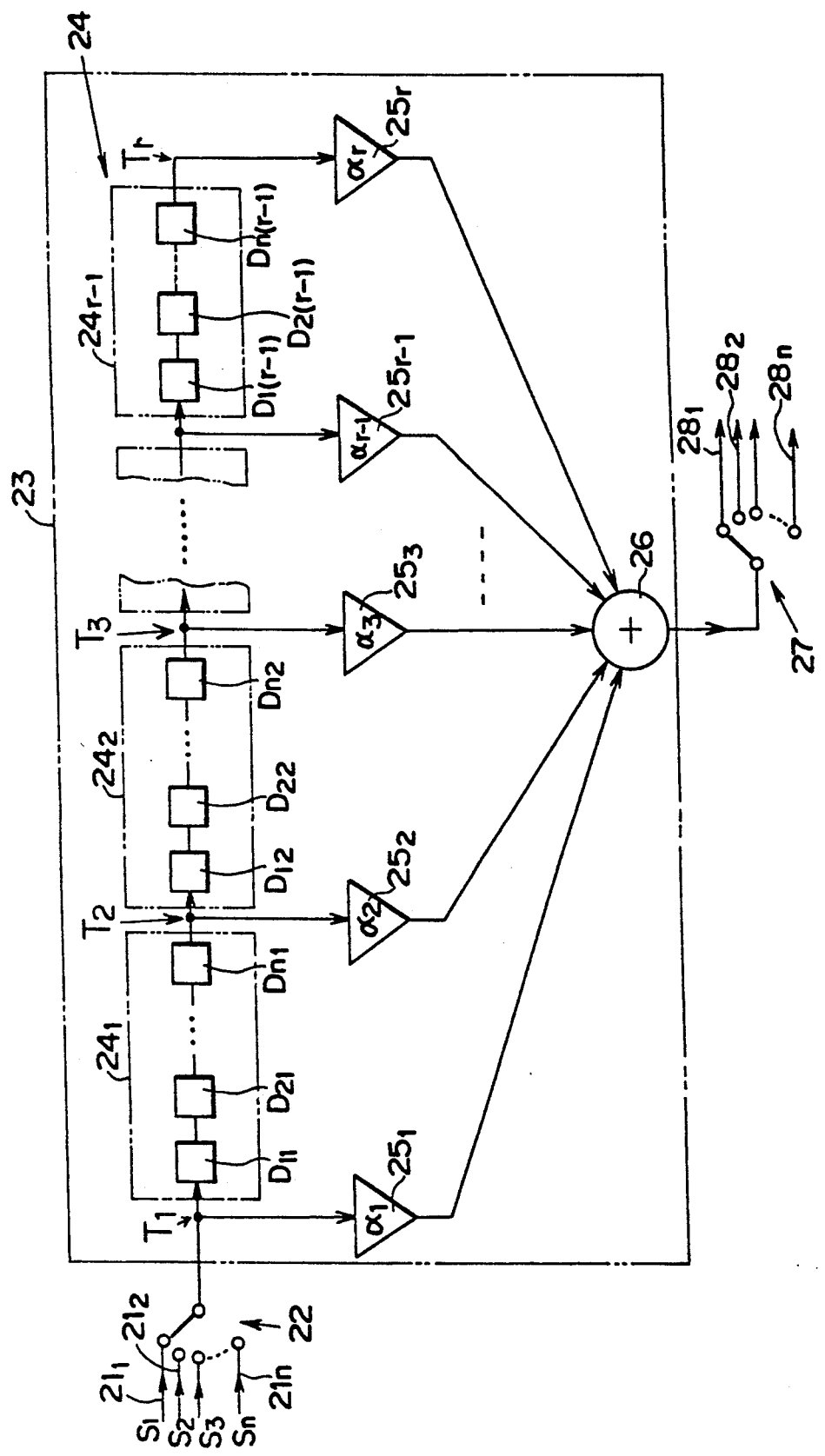
FIG. 3 is a block diagram showing a more general embodiment obtained by expanding the digital filter device of FIG. 1.

FIG. 3 illustrates a digital filter device according to a further embodiment of the present invention wherein the digital filter device of FIG. 1 is expanded for processing arbitrary n series of signals. In this embodiment, input signals $S_1$ to $S_n$ having a frequency $f_i$ on input signal lines $21_1$ to $21_n$ are switched at a frequency $1/(f_i \times n)$ by first switch means 22 and sequentially delivered to an FIR filter 23. The FIR filter 23 includes delay element blocks $24_1$ to $24_{r-1}$, each block consisting of n serially connected unit delay elements $D_{ij}$ (wherein i=1 to n and j=1 to r−1) having a delay time T equal to $1/(f_i \times n)$. Taps $T_1$ to $T_r$ are provided across respective delay element blocks $24_1$ to $24_{r-1}$ and connected to coefficient multiplier means $25_1$ to $25_r$ and then to adder means 26 in the same manner as in FIG. 1. The adder means 26, that is, FIR filter 23 is coupled to a second switch means 27 which is adapted to switch outputs of FIR filter 23 at frequency $f_i \times n$ for sequentially delivering them to n output signal lines $28_1$ to $28_n$.

The essential function of the digital filter device of FIG. 3 is understood by expanding the function of the digital filter device of FIG. 1 for two series to n series and its description is omitted for avoiding redundancy.

Figure 4:
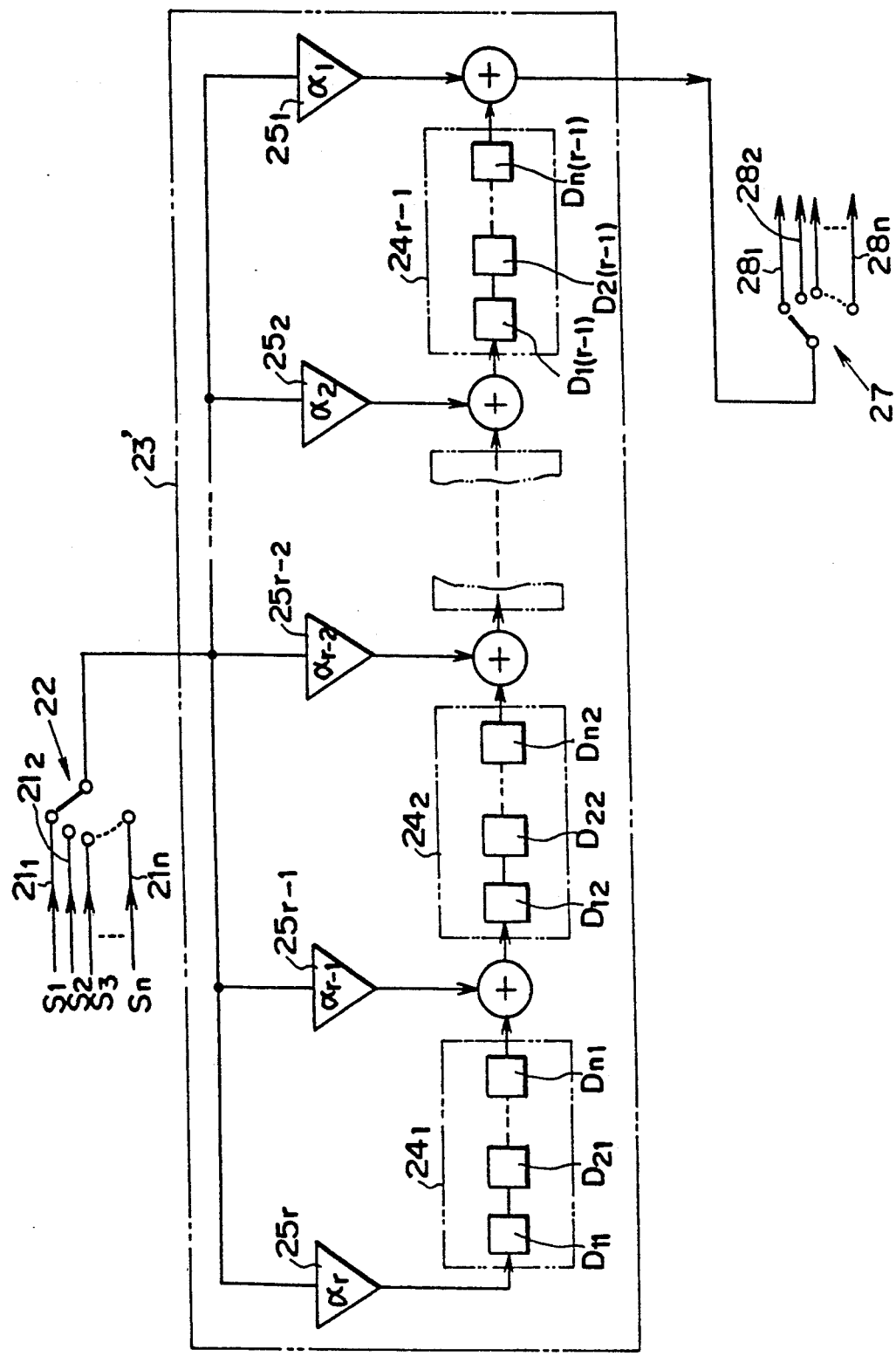
FIG. 4 is a block diagram showing a more general embodiment obtained by expanding the digital filter device of FIG. 2.

FIG. 4 illustrates the principle construction of a digital filter device according to a still further embodiment of the present invention using an FIR filter 23' which is a re-arrangement of the FIR filter 23 in the digital filter device of FIG. 3.

The digital filter device shown in FIGS. 1 to 4 are useful for sampling frequency conversion apparatus. The digital filter device shown in FIG. 3 or 4 is applicable as a sampling frequency conversion apparatus where different n series of serial data input signals having a common sampling frequency $f_i$ are supplied in parallel and n series of output signals having a sampling frequency $f_o$ converted from the input sampling frequency $f_i$ are delivered in parallel, with the ratio of the input (or unconverted) sampling frequency $f_i$ to the output (or converted) sampling frequency $f_o$ (i.e., $f_i:f_o$) being an integral ratio p:q wherein p and q are relatively prime integers. The digital filter device shown in FIG. 1 or 2 is applicable as a sampling frequency conversion apparatus particularly when n=2, that is, for processing two series of data signals.

Figure 5:
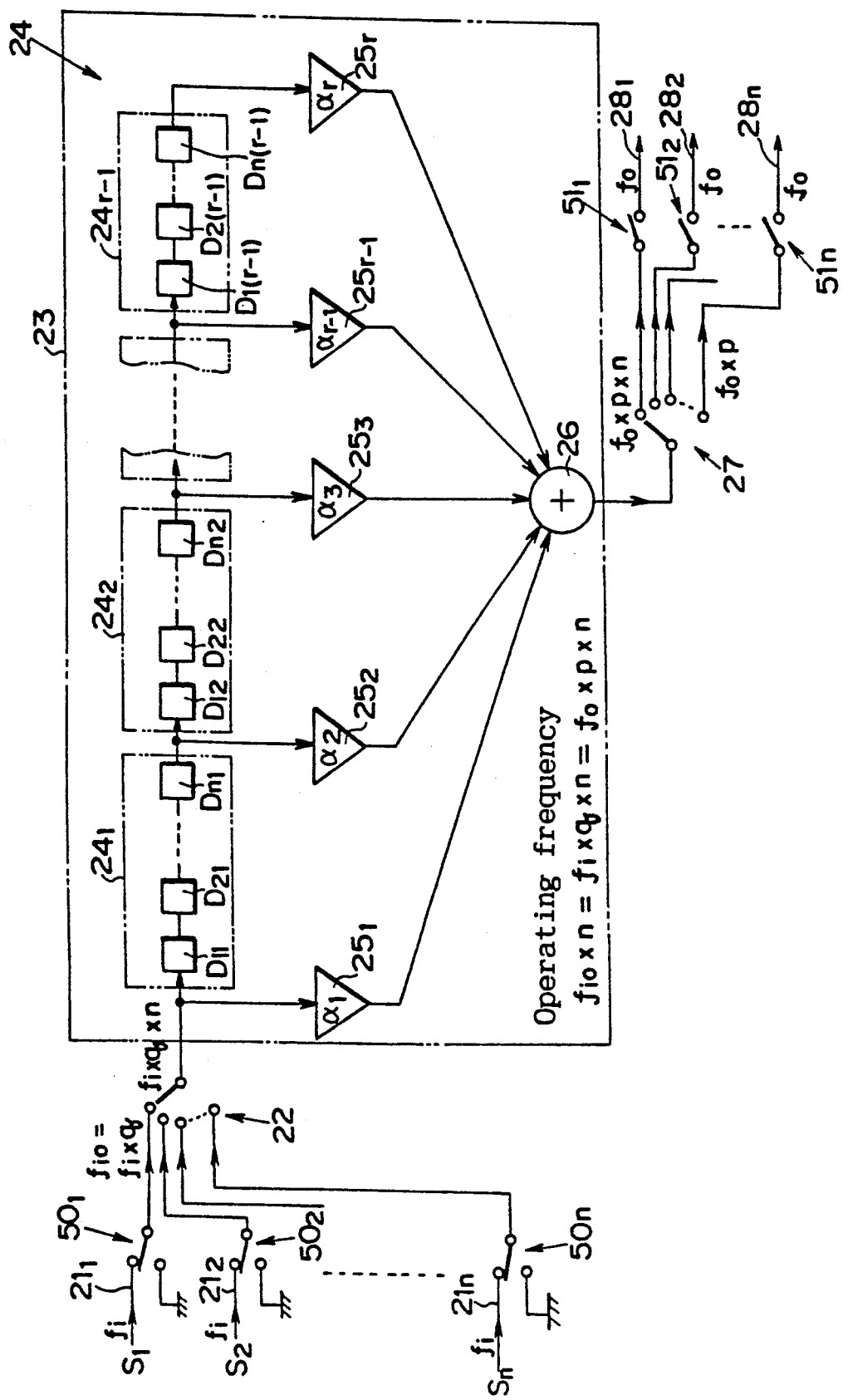
FIG. 5 is a block diagram showing one embodiment of the sampling frequency conversion apparatus according to the present invention.

Referring to FIG. 5, there is illustrated an embodiment wherein the digital filter device of FIG. 3 is applied to a sampling frequency conversion apparatus. The sampling frequency conversion apparatus of FIG. 5 includes a single FIR filter 23 which is of the same construction as the digital filter device of FIG. 3 except that the operating frequency of respective sections is set so as to allow for sampling frequency conversion.

More particularly, the sampling frequency conversion apparatus of FIG. 5 is designed such that n series of input signals $S_1$ to $S_n$ having a sampling frequency $f_i$ available on input signal lines $21_1$ to $21_n$ enter pre-switch means $50_1$ to $50_n$ whereby their frequency is converted to an apparent frequency of $f_i \times q = f_{io}$. The pre-switch means $50_1$ to $50_n$ each interpose (q−1) zero data between respective data of each of input signals $S_1$ to $S_n$ having a sampling frequency $f_i$ for forming signals having an apparent frequency of $f_i \times q = f_{io}$. A first switch means 22 is given n series of signals having an apparent frequency of $f_i \times q = f_{io}$. The first switch means 22 is adapted to switch the n series of signals from pre-switch means $50_1$ to $50_n$ at a frequency of $f_i \times q \times n$ for sequentially delivering them to single FIR filter 23. Therefore, FIR filter 23 receives signals having a frequency which is n times the least common multiple $f_{io}$ between the input sampling frequency $f_i$ before conversion and the output sampling frequency $f_o$ after conversion, that is, $f_{io} \times n$ ($=f_i \times q \times n = f_o \times p \times n$). The FIR filter 23 is adapted to operate at this frequency $f_{io} \times n$. More particularly, FIR filter 23 includes a delay element group 24 including delay element blocks $24_1$ to $24_{r-1}$, each block consisting of n serially connected unit delay elements $D_{ij}$ (wherein i=1 to n and j=1 to r−1) having a delay time T equal to $1/(f_{io} \times n)$. The signals across respective delay element blocks $24_1$ to $24_{r-1}$ each consisting of n unit delay elements $D_{ij}$ are subject to coefficient multiplication by coefficient multiplier means $25_1$ to $25_r$ and then to addition by adder means 26. Outputs of adder means 26 having frequency $f_{io} \times n$, which correspond to outputs of FIR filter 23, are sequentially distributed to n post-switch means $51_1$ to $51_n$ by second switch means 27 changing over at frequency $f_o \times p \times n$. The post-switch means $51_1$ to $51_n$ function so as not to transmit one of p data among the data of signals having frequency $f_o \times p$ from second switch means 27, differently stated, to take out (p−1) signals for forming signals having a frequency $f_o \times p/p = f_o$. In this way, outputs having frequency $f_o$ or frequency converted outputs develop on respective output signal lines $28_1$ to $28_n$.

It is to be noted that although the sampling frequency conversion apparatus having the digital filter device of FIG. 3 applied thereto is shown in FIG. 5, the digital filter device using an FIR filter of the re-arrangement type as shown in FIG. 4 is also applicable.

Figure 6:
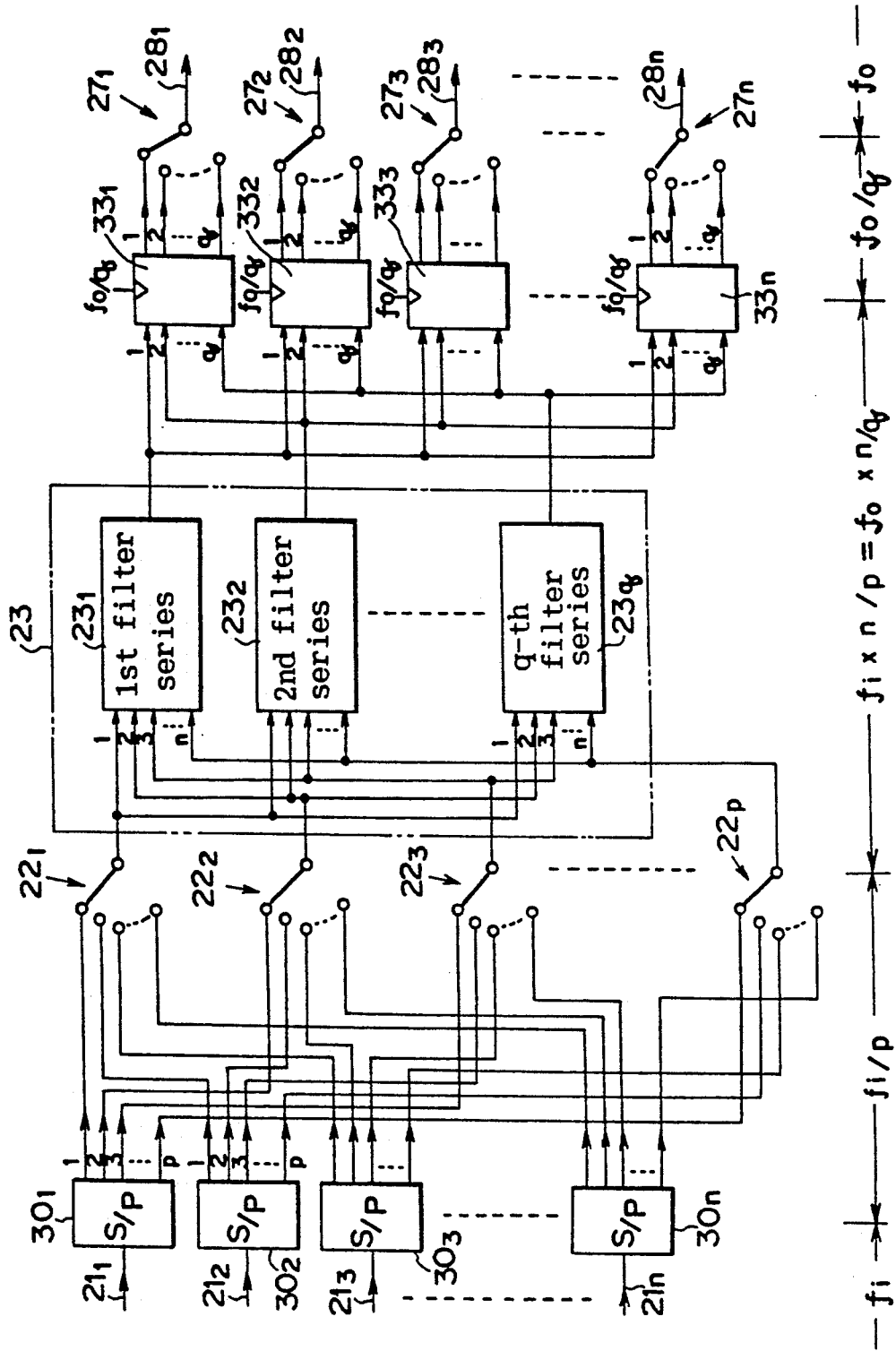
FIG. 6 is a block diagram showing another embodiment of the sampling frequency conversion apparatus according to the present invention.

FIG. 6 illustrates a more specific embodiment of the sampling frequency conversion apparatus of the present invention, that is, a sampling frequency conversion apparatus according to the fifth embodiment of the present invention. By taking advantage of the fact that the sampling frequency $f_i$ before conversion and the sampling frequency $f_o$ after conversion have a predetermined integral ratio p:q wherein p and q are relatively prime integers with p≧2, signals of plural (n) series are processed in a time sharing manner and at the same time, signals of each series are processed in parallel.

In FIG. 6, n series of signal input lines $21_1$ to $21_n$ are connected to serial/parallel conversion apparatus $30_1$ to $30_n$, respectively. These serial/parallel conversion apparatus $30_1$ to $30_n$ are to convert data signals having sampling frequency $f_i$ into p parallel signals and thus provide p signals having a frequency of $f_i/p$ as parallel outputs.

The serial/parallel conversion apparatus $30_1$ to $30_n$ at the output are coupled to p first switch means $22_1$ to $22_p$, respectively. These first switch means $22_1$ to $22_p$, typically each in the form of a multiplexor, each serve to sequentially take out one output from n inputs at a frequency of $f_i \times n/p$. The first switch means $22_1$ to $22_p$ at the output are coupled to an FIR filter 23. The FIR filter 23 includes q parallel arranged filter series or trains $23_1$ to $23_q$ which operate at a frequency of $f_i \times n/p$ ($=f_o \times n/q$). The FIR filter 23 at its output or filter series $23_1$ to $23_q$ at their output are coupled to n holding means $33_1$ to $33_n$, respectively. The holding means $33_1$ to $33_n$, typically each in the form of a latch, function for temporarily holding each output signal from FIR filter 23 using clocks having a frequency $f_o/q$ whose phase is shifted by $q/(f_o \times n)$. The holding means $33_1$ to $33_n$ at their output are coupled to n second switch means $27_1$ to $27_n$. These second switch means $27_1$ to $27_n$ each serve to sequentially take out one output from q inputs at a frequency of $f_o$. The second switch means $27_1$ to $27_n$ at their output are coupled to output signal lines $28_1$ to $28_n$, respectively.

The sampling frequency conversion apparatus illustrated in FIG. 6 operates as follows. With n series of data signals having sampling frequency $f_i$ supplied to input signal lines $21_1$ to $21_n$, serial/parallel conversion apparatus $30_1$ to $30_n$ convert data signals of each series into p parallel signals having frequency $f_i/p$. These p parallel signals of each series are switched by p first switch means $22_1$ to $22_p$ at frequency $f_i \times n/p$ so that p parallel signals of the same series are supplied to FIR filter 23. That is, at a certain point of time, p parallel signals of one series (e.g., n=1) are simultaneously supplied to FIR filter 23, and at a next point of time, p parallel signals of the next series (e.g., n=2) are simultaneously supplied to FIR filter 23. These parallel signals, that is, output signals of first switch means $22_1$ to $22_p$ have a frequency of $f_i \times n/p$ ($=f_o \times n/q$).

The filter series $23_1$ to $23_q$ of FIR filter 23 operate at frequency $f_i \times n/p = f_o \times n/q$ so that p signals of one series (e.g, n=1 series) are parallel processed at a certain point of time and p signals of the next series (e.g, n=2 series) are parallel processed at a next point of time. This means that FIR filter 23 carries out time sharing processing of plural series of signals and parallel processing of signals of each series. Outputs of filter series $23_1$ to $23_q$, that is, signals having frequency $f_o \times n/q$ are parallel delivered to holding means $33_1$ to $33_n$ where the parallel signals are held with clocks having frequency $f_o/q$, and then q parallel signals having frequency $f_o/q$ are delivered to second switch means $27_1$ to $27_n$. Since the clocks associated with holding means $33_1$ to $33_n$ having frequency $f_o/q$ have a phase shifted by $q/(f_o \times n)$, parallel signals having frequency $f_o/q$ (or period $q/f_o$) from holding means $33_1$ to $33_n$ have a phase shift corresponding to 1/n of one period for each holding means. As a result of shifting the phase by 1/n of one period, parallel output signals of each holding means $33_1$ to $33_n$ correspond to input signals of each series. More particularly, parallel outputs of the first holding means $33_1$ correspond to input signals of the first (n=1) series, parallel outputs of the second holding means $33_2$ correspond to input signals of the second (n=2) series, and parallel outputs of the n-th holding means $33_n$ correspond to input signals of the n-th series.

In this way, parallel signals having frequency $f_o/q$ entering each second switch means $27_1$ to $27_n$ are sequentially switched at frequency $f_o$ and delivered to respective output signal lines $28_1$ to $28_n$ as signals having frequency $f_o$. That is, parallel signals for each series are converted into serial signals and delivered as signals having frequency $f_o$.

Figure 8:
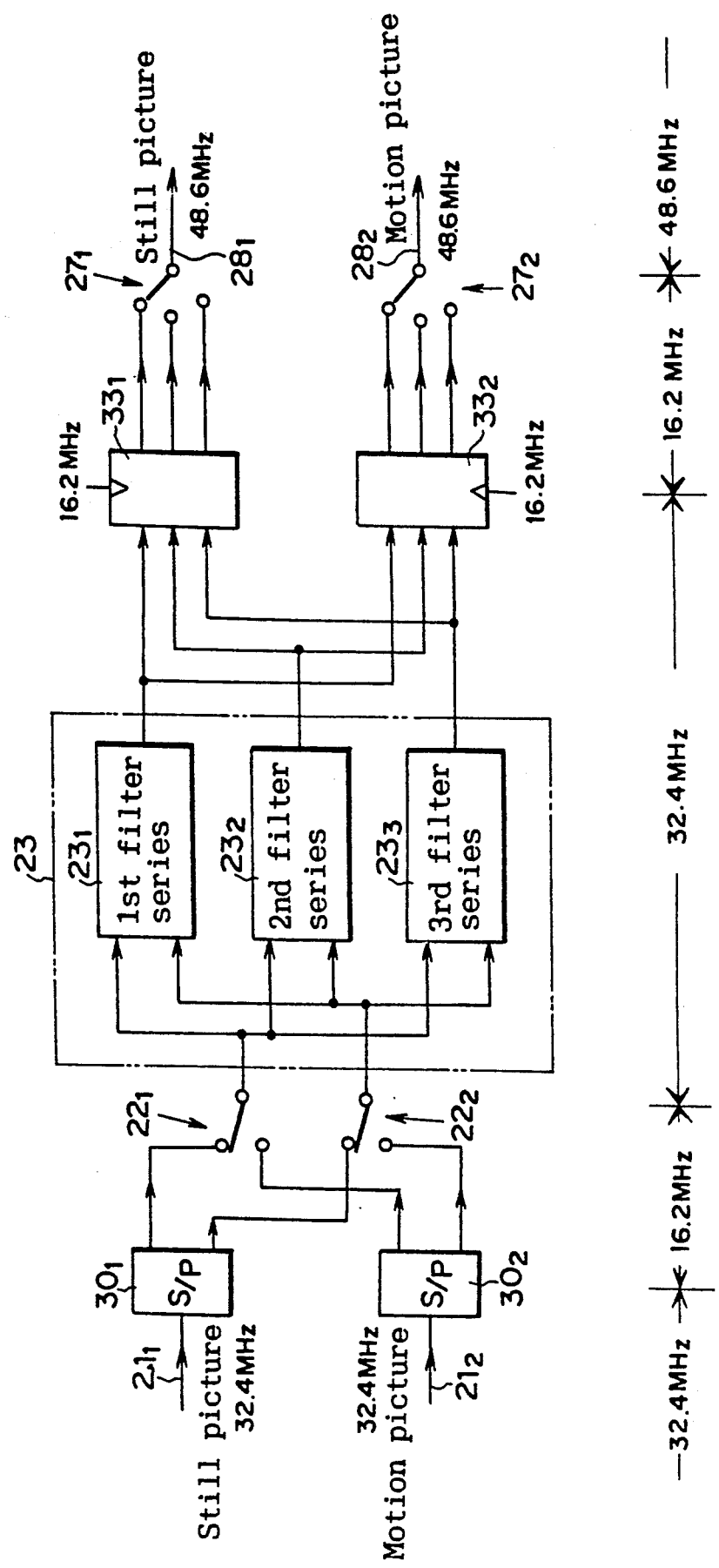
FIG. 8 is a block diagram showing one principle embodiment of the sampling frequency conversion apparatus for use in the MUSE decoder according to the present invention.

As previously mentioned, in the sampling frequency conversion apparatus used in the MUSE decoder, the sampling frequency $f_i$ before conversion is 32.4 MHz and the sampling frequency $f_o$ after conversion is 48.6 MHz. This means that their ratio is $f_i:f_o=p:q=2:3$. That is, p=2 and q=3. Since the signal series involved are two series of signals, intermediately processed still and motion picture signals, n=2. Consequently, the sampling frequency conversion apparatus of FIG. 6 is ready for use in the MUSE decoder by introducing conditions: n=2, p=2, and q=3 therein. An example of this situation is illustrated in FIG. 8 which will be described later.

Figure 7:
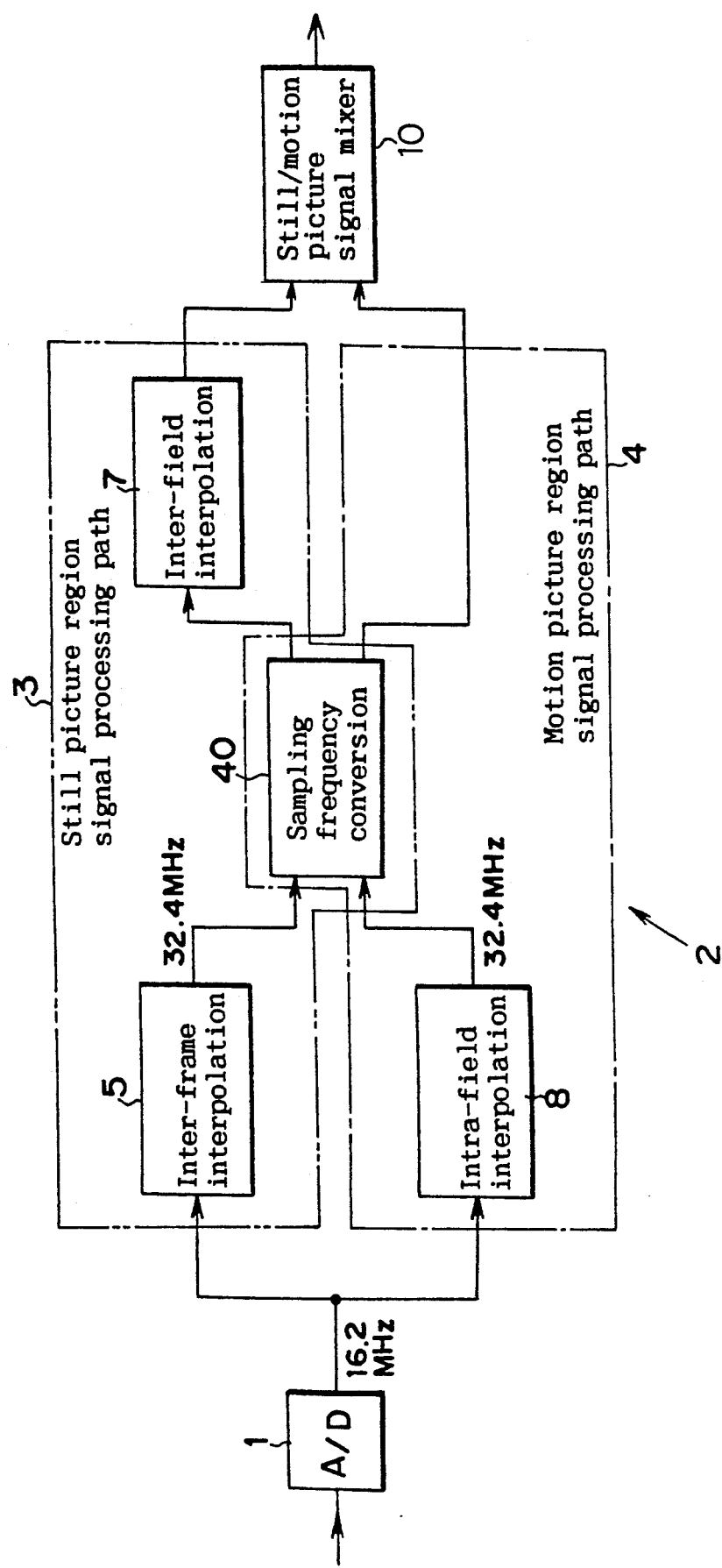
FIG. 7 is a block diagram showing one principle embodiment of the MUSE decoder according to the present invention.

FIG. 7 illustrates the principle construction of a MUSE decoder having built therein a sampling frequency conversion apparatus in the form of a digital filter as mentioned above.

In FIG. 7, an A/D converter 1 receives analog signals at the input, picks up data signals having a sampling frequency of 16.2 MHz as MUSE signals from the input signals, and deliver the MUSE signals to a MUSE decoder 2. The MUSE decoder 2 includes still and motion picture region signal processing paths 3 and 4 and a still/motion picture signal mixer means 10. The still picture region signal processing path 3 includes an inter-frame interpolation means 5, a sampling frequency conversion apparatus 40, and an inter-field interpolation means 7. The motion picture region signal processing path 4 includes an intra-field interpolation means 8 and the same sampling frequency conversion apparatus 40. The sampling frequency conversion apparatus 40 is shared by still and motion picture region signal processing paths 3 and 4.

In still picture region signal processing path 3 of the decoder shown in FIG. 7, A/D converter 1 delivers MUSE signals having a sampling frequency of 16.2 MHz to inter-frame interpolation means 5 which complements data one by one between data of the MUSE signals of 16.2 MHz between adjacent frames and as a result, delivers data signals having a frequency twice the original, 32.4 MHz (intermediately processed still picture signals) to sampling frequency conversion apparatus 40. The MUSE signals having a sampling frequency of 16.2 MHz are also delivered to the intra-field interpolation means 8 of the motion picture region signal processing path 4 which complements data one by one between data in a common field from the adjacent data and as a result, delivers data signals having a frequency twice the original, 32.4 MHz (intermediately processed motion picture signals) to sampling frequency conversion apparatus 40.

The sampling frequency conversion apparatus 40 carries out frequency conversion on the intermediately processed still picture signals of 32.4 MHz and the intermediately processed motion picture signals of 32.4 MHz in a time sharing manner and produce respective output signals of 48.6 MHz in parallel. The intermediately processed still picture signals now of 48.6 MHz are subject to inter-field interpolation by inter-filed interpolation means 7 along still picture processing path 3 before they are mixed with the intermediately processed motion picture signals now of 48.6 MHz in the still/motion picture signal mixer means 10, thus regenerating signals for forming an overall image.

In principle, the sampling frequency conversion apparatus 40 used herein may be the digital filter device shown in FIG. 5. In this conversion apparatus, the input sampling frequency $f_i$ is 32.4 MHz for both the intermediately processed still and motion picture signals and the output sampling frequency $f_o$ is 48.6 MHz for both the intermediately processed still and motion picture signals. This means $f_i:f_o=p:q=2:3$, that is, p=2 and q=3, and the number of signal series is two (n=2). Then frequency $f_{io}$ which is the least common multiple between the input sampling frequency $f_i$ and the output sampling frequency $f_o$ is 97.6 MHz. Accordingly, FIR filter 23 should operate at a twice 97.6 MHz frequency, that is, 195.2 MHz and each of delay element blocks $24_1$ to $24_{r-1}$ be a serial connection of two unit delay elements each having a delay time T of 1/195.2.

The above-mentioned construction is less desirable in that FIR filter 23 should operate at a frequency as high as 195.2 MHz, requiring delay elements capable of high speed operation which are relatively expensive. It is thus desirable to use a sampling frequency conversion apparatus of the parallel processing type as shown in FIG. 6. That is, a sampling frequency conversion apparatus as shown in FIG. 8 which corresponds to FIG. 6 wherein n=2, p=2, and q=3 is best suited for the MUSE decoder.

Referring to FIG. 8, the sampling frequency conversion apparatus for use in the MUSE decoder includes a first serial/parallel converter means $30_1$ which receives intermediately processed still picture signals of 32.4 MHz from an input signal line $21_1$ and a second serial/parallel converter means $30_2$ which receives intermediately processed motion picture signals of 32.4 MHz from an input signal line $21_2$. These serial/parallel converter means $30_1$ and $30_2$ provide parallel signals having a frequency reduced one half to 16.2 MHz, which are alternately selected by first switch means $22_1$ and $22_2$ changing over at 32.4 MHz for delivery to an FIR filter 23. That is, parallel signals corresponding to the intermediately processed still picture signals and parallel signals corresponding to the intermediately processed motion picture signals are alternately delivered to FIR filter 23 with time sharing at 32.4 MHz. The FIR filter 23 includes three parallel arranged filter series $23_1$, $23_2$ and $23_3$ which operate at a frequency of 32.4 MHz. Thus these filter series $23_1$, $23_2$ and $23_3$ perform alternate time sharing processing of data of intermediately processed still picture signals and data of intermediately processed motion picture signals and at the same time, parallel processing within each shared time duration. The filter series $23_1$, $23_2$ and $23_3$ deliver outputs of 32.4 MHz in parallel to two holding means $33_1$ and $33_2$ each in the form of a latch. The holding means $33_1$ and $33_2$ function to temporarily hold each of output signals from filter series $23_1$, $23_2$ and $23_3$ using clocks having a frequency of 16.2 MHz whose phase is shifted by half a period (1/32.4 MHz) and then deliver parallel signals of 16.2 MHz whose phase is shifted by half a period. Parallel signals at the output of one holding means $33_1$ are sequentially switched by a switch means $27_1$ in the form of a multiplexor at a frequency of 48.6 MHz and delivered to an output signal line $28_1$ as intermediately processed still picture signals having a converted sampling frequency of 48.6 MHz. Similarly, parallel signals at the output of the other holding means $33_2$ are sequentially switched by another switch means $27_2$ in the form of a multiplexor at a frequency of 48.6 MHz and delivered to an output signal line $28_2$ as intermediately processed motion picture signals having a converted sampling frequency of 48.6 MHz.

Figure 9:
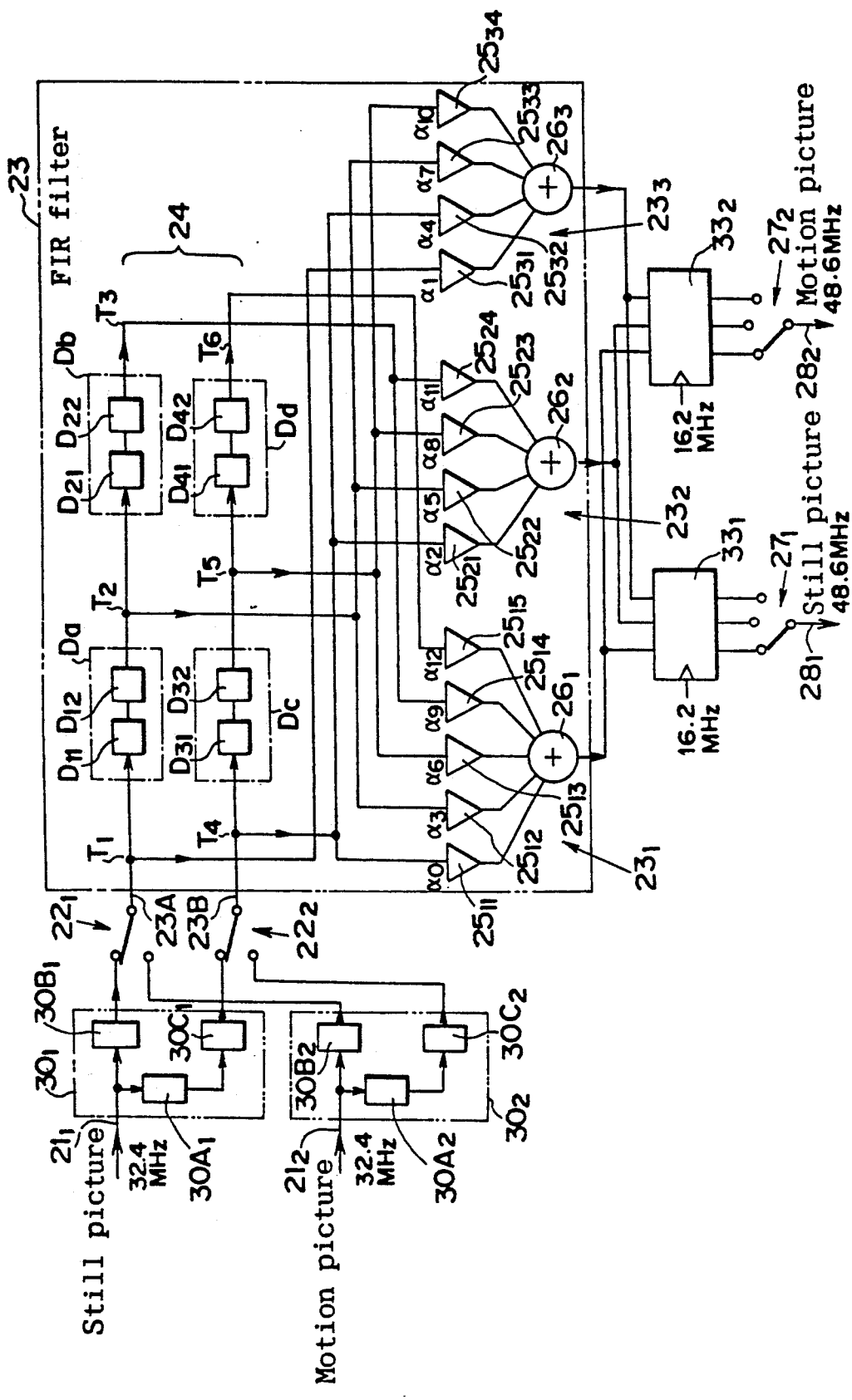
FIG. 9 is a block diagram showing a specific embodiment of the sampling frequency conversion apparatus of FIG. 8.

FIG. 9 shows a specific embodiment of the sampling frequency conversion apparatus for the MUSE decoder of FIG. 8.

In FIG. 9, serial/parallel converter means $30_1$ coupled to input signal line $21_1$ for receiving intermediately processed still picture signals of 32.4 MHz includes a shift register $30A_1$ operating at 32.4 MHz and a pair of shift registers $30B_1$ and $30C_1$ coupled to the input and output of shift register $30A_1$ and operating at 16.2 MHz. Similarly, parallel/serial converter means $30_2$ coupled to input signal line $21_2$ for receiving intermediately processed motion picture signals of 32.4 MHz includes a shift register $30A_2$ operating at 32.4 MHz and a pair of shift registers $30B_2$ and $30C_2$ coupled to the input and output of shift register $30A_2$ and operating at 16.2 MHz. The shift registers $30B_1$ and $30B_2$ at their output are coupled to one switch means $22_1$, and shift registers $30C_1$ and $30C_2$ at their output are coupled to the other switch means $22_2$. The three filter series or trains $23_1$, $23_2$ and $23_3$ constituting FIR filter 23 are common in a delay element section (i.e., share a delay element group 24), but separate in coefficient multiplication and addition sections (i.e., have three separate series of coefficient multiplier and adder means 25 and 26). More particularly, the delay element group 24 of FIR filter 23 includes four delay element sets Da, Db, Dc and Dd each consisting of a pair of serially connected unit delay elements $D_1$, $D_{12}$; $D_{21}$, $D_{22}$; $D_{31}$, $D_{32}$; and $D_{41}$, $D_{42}$ having a delay time T of 1/32.4 MHz. Among these, two delay element sets Da and Db are serially connected to the output of one switch means $22_1$ and two delay element sets Dc and Dd are serially connected to the output of the other switch means $22_2$. The first filter series $23_1$ includes coefficient multiplier means $25_{11}$, $25_{12}$, $25_{13}$, $25_{14}$ and $25_{15}$, second filter series $23_2$ includes coefficient multiplier means $25_{21}$, $25_{22}$, $25_{23}$, and $25_{24}$, and third filter series $23_3$ includes coefficient multiplier means $25_{31}$, $25_{32}$, $25_{33}$, and $25_{34}$. which are connected to taps $T_1$, $T_2$, $T_3$, $T_4$, $T_5$ and $T_6$ across respective delay element sets Da, Db, Dc and Dd in a predetermined relationship as shown in FIG. 9. The coefficient multiplier means $25_{11}$ to $25_{15}$ of first filter series $23_1$ are coupled to a first adder means $26_1$, coefficient multiplier means $25_{21}$ to $25_{24}$ of second filter series $23_2$ coupled to a second adder means $26_2$, and coefficient multiplier means $25_{31}$ to $25_{34}$ of third filter series $23_3$ coupled to a third adder means $26_3$. The outputs of these adder means $26_1$ to $26_3$, that is, the outputs of filter series $23_1$ to $23_3$ are coupled to two holding means in the form of latches $33_1$ and $33_2$. These latches $33_1$ and $33_2$ are adapted to hold signals using clocks having a frequency of 16.2 MHz. The clock associated with one latch $33_1$ is phase shifted by half the period (=1/32.4 MHz) from the clock associated with the other latch $33_2$. The latches $33_1$ and $33_2$ at their output are coupled to switch means $27_1$ and $27_2$, respectively, which at their output are coupled to still and motion picture output signal lines $28_1$ and $28_2$, respectively.

In the sampling frequency conversion apparatus for the MUSE decoder shown in FIG. 9, as previously described for the embodiment of FIG. 8, intermediately processed still picture signals of 32.4 MHz along input signal line $21_1$ enter first serial/parallel converter $30_1$ where they are converted into two parallel signals of 16.2 MHz. Since the path for one of the parallel signals includes shift register $30A_1$ operating at 32.4 MHz, data are delayed by 1/32.4 MHz in the path. Similarly, intermediately processed motion picture signals of 32.4 MHz along input signal line $21_2$ enter second serial/parallel converter $30_2$ where they are converted into two parallel signals of 16.2 MHz. Since the path for one of the parallel signals includes shift register $30A_2$ operating at 32.4 MHz, data are delayed by 1/32.4 MHz in the path. These parallel signals are alternately switched by switch means $22_1$ and $22_2$ at a frequency of 32.4 MHz and delivered to FIR filter 23. More particularly, parallel signals relating to intermediately processed still picture signal data are simultaneously provided to two input signal lines 23A and 23B of FIR filter 23 at a certain point of time, and parallel signals relating to intermediately processed motion picture signal data are simultaneously provided to two input signal lines 23A and 23B of FIR filter 23 at the next, 1/32.4 MHz later point of time.

As mentioned above, the delay element group 24 of FIR filter 23 includes four delay element sets Da, Db, Dc and Dd each consisting of a pair of serially connected unit delay elements having a delay time T of 1/32.4 MHz. The delay time taken across the respective delay element pairs (between taps $T_1$ to $T_6$) is 1/16.2 MHz. Then intermediately processed still picture signal data simultaneously develop at taps $T_1$ to $T_6$ at a certain point of time, and intermediately processed motion picture signal data simultaneously develop at taps $T_1$ to $T_6$ at the next point of time.

It is now assumed that the data of intermediately processed still picture signals of 32.4 MHz are designated $X_0$, $X_1$, $X_2$, $X_3$, $X_4$ and $X_5$ from the oldest to the latest one on a time sequence and similarly, the data of intermediately processed motion picture signals of 32.4 MHz are designated $Y_0$, $Y_1$, $Y_2$, $Y_3$, $Y_4$ and $Y_5$ from the oldest to the latest one, the coefficients to be multiplied by the respective coefficient multiplier means $21_{11}$ to $25_{15}$, $25_{21}$ to $25_{24}$, and $25_{31}$ to $25_{34}$ are $\alpha_0$, $\alpha_1$, $\alpha_2$, ..., $\alpha_{12}$ (the correspondence of coefficients to the multiplier means is shown in FIG. 9).

As mentioned above, data relating to intermediately processed still picture signals simultaneously develop at taps $T_1$ to $T_6$ at a certain point of time or timing. As understood from the foregoing description, with respect to data supplied to one input signal line 23A of FIR filter 23, data supplied to the other input signal line 23B are delayed by 1/32.4 MHz. Accordingly, at the point of time when data $X_0$ of intermediately processed still picture signals develops at tap $T_6$, data $X_1$ develops at tap $T_3$, $X_2$ at tap $T_5$, $X_3$ at tap $T_2$, $X_4$ at tap $T_4$, and $X_5$ at tap $T_1$, respectively. Then, the output of adder means $26_1$ of first filter series $23_1$, that is, final output $SS_1$ of first filter series $23_1$ at this point of time is represented by the following equation.

$$SS_1 = \alpha_0 \times X_4 + \alpha_3 \times X_3 + \alpha_6 \times X_2 + \alpha_9 \times X_1 + \alpha_{12} \times X_0$$

Similarly, the output of adder means $26_2$ of second filter series $23_2$, that is, final output $SS_2$ of second filter series $23_2$ at the same point of time is represented by the following equation.

$$SS_2 = a_2 x X_4 + a_5 x X_3 + a_8 x X_2 + a_{11} x X_1$$

Also, the output of adder means $26_3$ of third filter series $23_3$, that is, final output $SS_3$ of third filter series $23_3$ at the same point of time is represented by the following equation.

$$SS_3 = a_1 x X_5 + a_4 x X_4 + a_7 x X_3 + a_{10} x X_2$$

At the next, 1/32.4 MHz later point of time, data $Y_0$ to $Y_5$ of intermediately processed motion picture signals simultaneously develop at taps $T_1$ to $T_6$. More particularly, data $Y_0$ develops at tap $T_6$, and at the same time, data $Y_1$ develops at tap $T_3$, $Y_2$ at tap $T_5$, $Y_3$ at tap $T_2$, $Y_4$ at tap $T_4$, and $Y_5$ at tap $T_1$, respectively. Then, the output of adder means $26_1$ of first filter series $23_1$, that is, final output $DS_1$ of first filter series $23_1$ at said next point of time is represented by the following equation.

$$DS_1 a_0 x Y_4 + a_3 x Y_3 + a_6 x Y_2 + a_9 x Y_1 + a_{12} x Y_0$$

Similarly, the output of adder means $26_2$ of second filter series $23_2$, that is, final output $DS_2$ of second filter series $23_2$ at the same point of time is represented by the following equation.

$$DS_2 = a_2 x Y_4 + a_5 x Y_3 + a_8 x Y_2 + a_{11} x Y_1$$

Also, the output of adder means $26_3$ of third filter series $23_3$, that is, final output $DS_3$ of third filter series $23_3$ at the same point of time is represented by the following equation.

$$DS_3 = a_1 x Y_5 + a_4 x Y_4 + a_7 x Y_3 + a_{10} x Y_2$$

Figure 10:
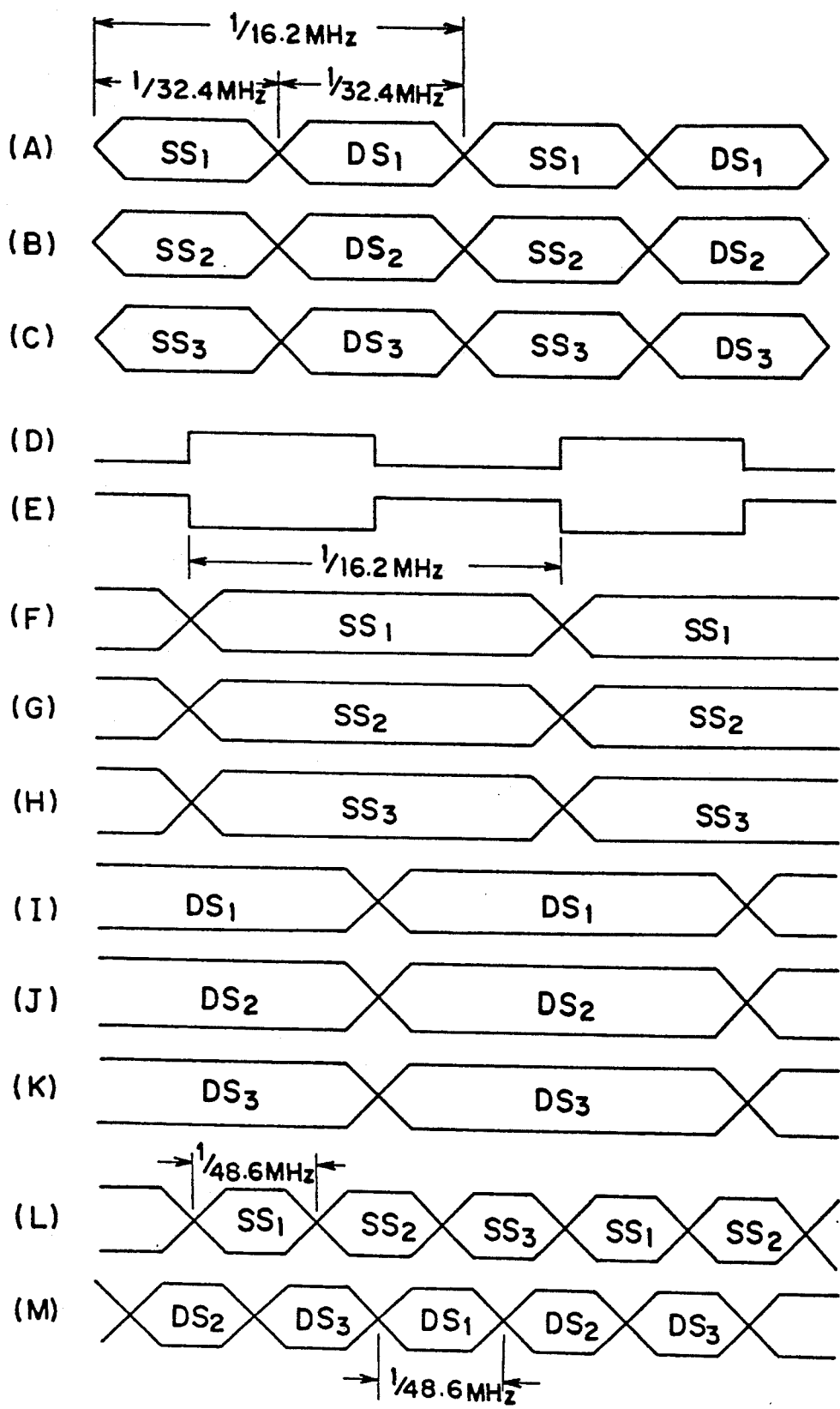
FIG. 10 is a chart showing data states at respective sections of the sampling frequency conversion apparatus for MUSE decoder of FIG. 9.
Figure 11:
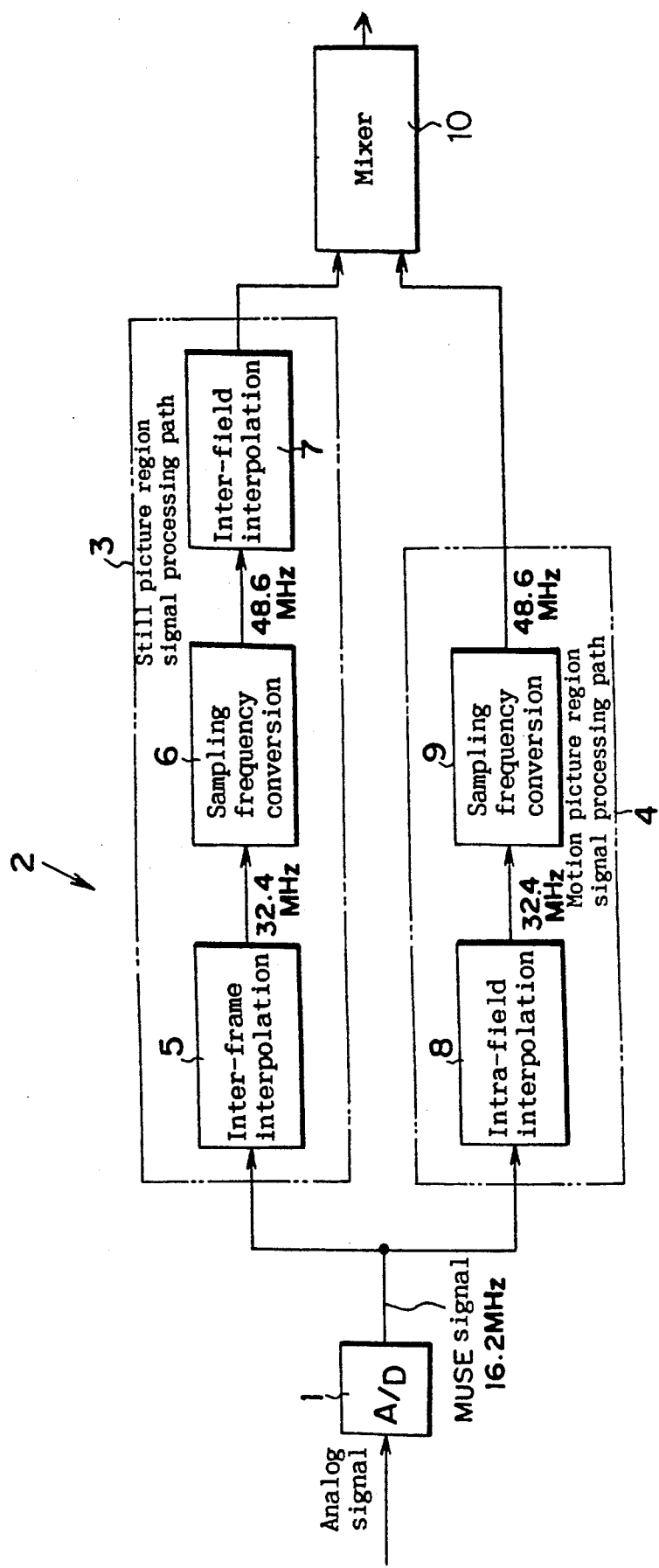
FIG. 11 is a block diagram showing one principle embodiment of a prior art MUSE decoder.
Figure 12:
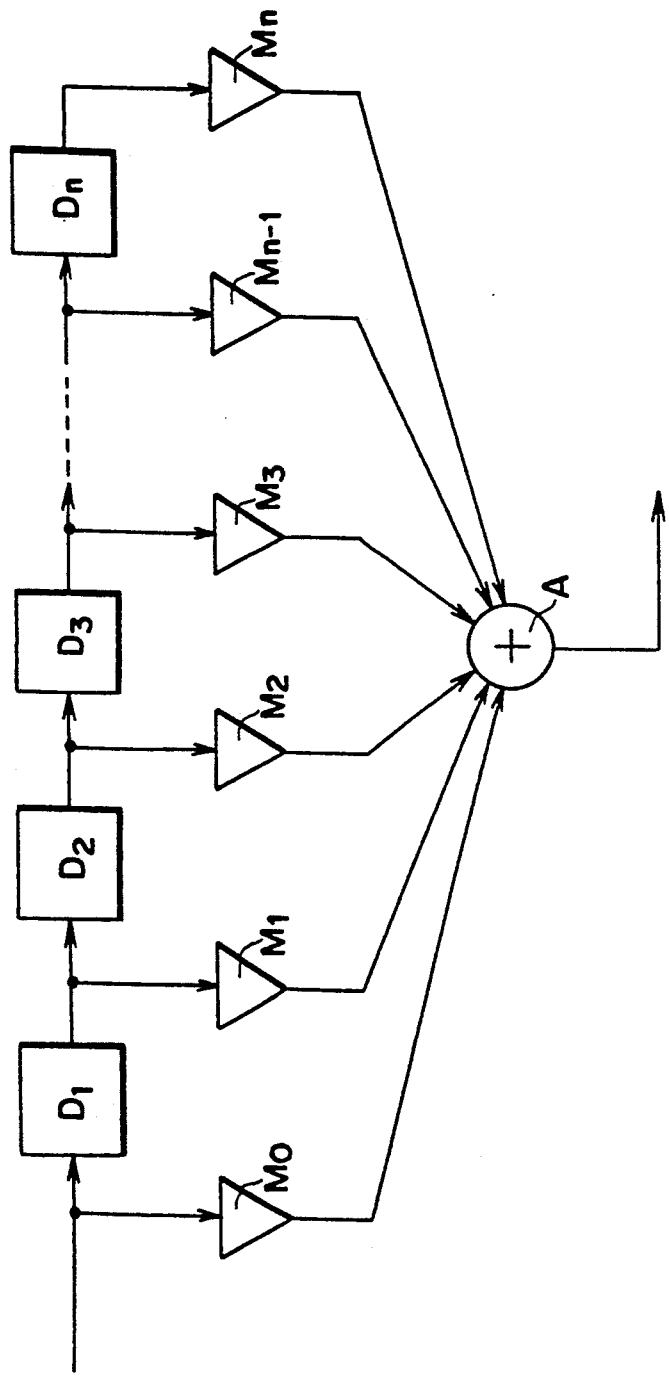
FIG. 12 is a block diagram showing one principle embodiment of a prior art FIR filter.
Figure 13:
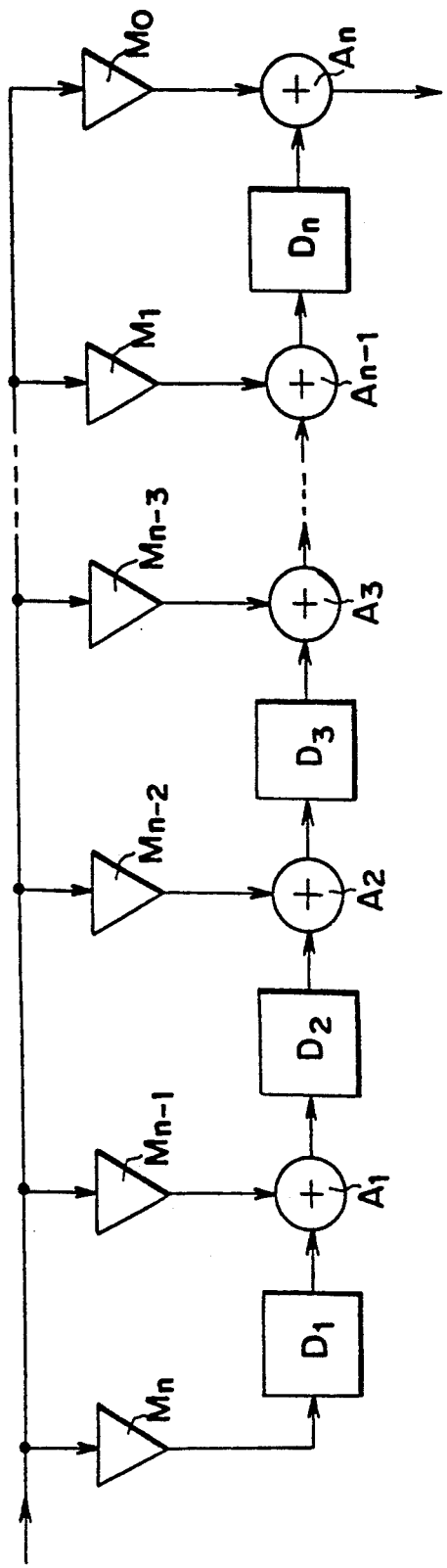
FIG. 13 is a block diagram showing another principle embodiment of a prior art FIR filter.
Figure 14:
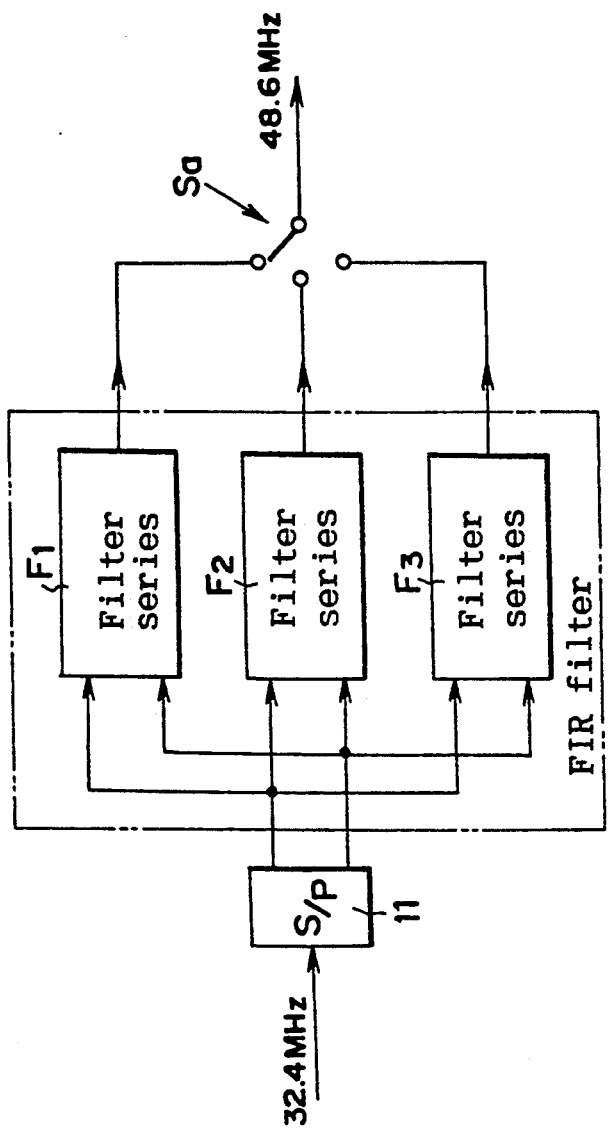
FIG. 14 is a block diagram showing one principle embodiment of a prior art sampling frequency conversion apparatus for MUSE decoder.
Figure 15:
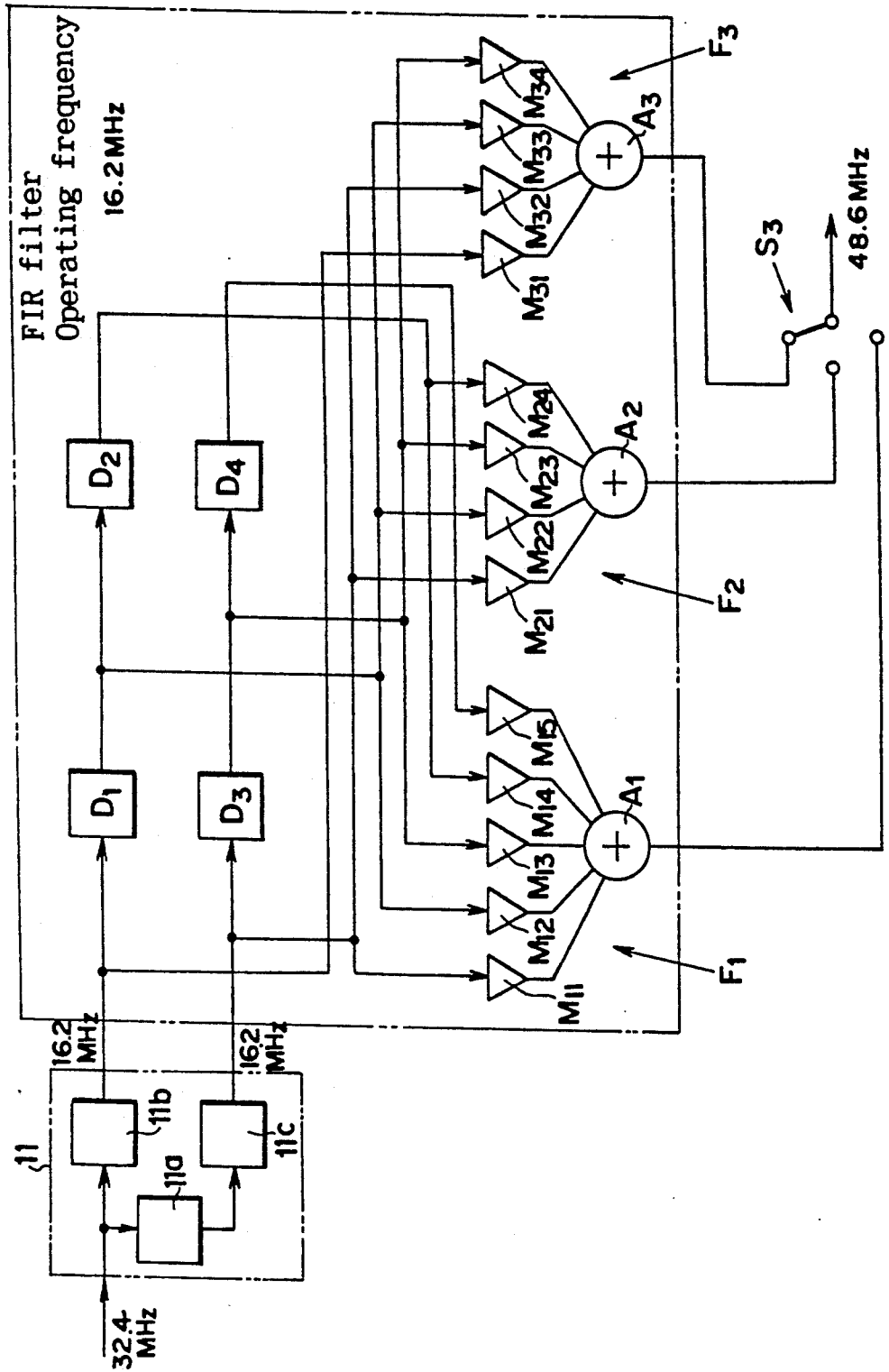
FIG. 15 is a block diagram showing a specific embodiment of the prior art sampling frequency conversion apparatus of FIG. 14.

The output data of the respective filter series $23_1$ to $23_3$ are shown in the time series diagram of FIG. 10. FIG. 10(A) shows the output data of first filter series $23_1$, FIG. 10(B) shows the output data of second filter series $23_2$, and FIG. 10(C) shows the output data of third filter series $23_3$.

The clock associated with latch $33_1$ is represented by FIG. 10(D) and the clock associated with latch $33_2$ is represented by FIG. 10(E). These clocks have a common frequency of 16.2 MHz, but a phase shift of 1/32.4 MHz. Then one latch $33_1$ delivers data ($SS_1$) relating to the intermediately processed still picture signals provided by first filter series $23_1$ as shown in FIG. 10(F), data ($SS_2$) relating to the intermediately processed still picture signals provided by second filter series $23_2$ as shown in FIG. 10(G), and data ($SS_3$) relating to the intermediately processed still picture signals provided by third filter series $23_3$ as shown in FIG. 10(H), as parallel signals of 16.2 MHz. The other latch $33_2$ delivers data ($DS_1$) relating to the intermediately processed motion picture signals provided by first filter series $23_1$ as shown in FIG. 10(I), data ($DS_2$) relating to the intermediately processed motion picture signals provided by second filter series $23_2$ as shown in FIG. 10(J), and data ($DS_3$) relating to the intermediately processed motion picture signals provided by third filter series $23_3$ as shown in FIG. 10(K), as parallel signals of 16.2 MHz.

The three parallel outputs of one latch $33_1$ relating to the intermediately processed still picture signal are sequentially switched by switch means $27_1$ at 48.6 MHz. Then the output data ($SS_1$) of first filter series $23_1$, the output data ($SS_2$) of second filter series $23_2$, and the output data ($SS_3$) of third filter series $23_3$ develop sequentially or serially at 48.6 MHz on still picture output signal line $28_1$ as shown in FIG. 10(L). There are eventually developed intermediately processed still picture signals having a sampling frequency converted to 48.6 MHz.

Similarly, the three parallel outputs of the other latch $33_2$ relating to the intermediately processed motion picture signal are sequentially switched by switch means $27_2$ at 48.6 MHz. Then the output data ($DS_1$) of first filter series $23_1$, the output data ($DS_2$) of second filter series $23_2$, and the output data ($DS_3$) of third filter series $23_3$ develop sequentially or serially at 48.6 MHz on motion picture output signal line $28_2$ as shown in FIG. 10(M). There are eventually developed intermediately processed motion picture signals having a sampling frequency converted to 48.6 MHz.

ADVANTAGES

There has been described the digital filter device for use in signal processing paths for parallel processing n series of input signals having a common sampling frequency $f_i$ and parallel delivering n series of output signals. For signals of the respective series, a single FIR filter is commonly used in a time sharing manner without an interference between the series. As compared with the prior art design using separate FIR filters for respective signal series, the digital filter device of the invention can achieve a significant reduction in the number of elements and cost therewith.

The sampling frequency conversion apparatus of the present invention is effective for converting plural (n) series of input signals having a common sampling frequency $f_i$ into plural series of output signals having a sampling frequency $f_o$ by using a single FIR filter in a time sharing manner without an interference. There is also achieved a significant reduction in the number of elements and cost therewith.

The MUSE decoder of the invention is effective for converting the sampling frequency of both still and motion picture-related signals by using a single FIR filter in a time sharing manner without an interference. As compared with the prior art MUSE decoder using separate sampling frequency converters (FIR filters) for still and motion picture region signal processing paths, the MUSE decoder of the invention can achieve a significant reduction in the number of elements and cost therewith.

While the invention has been described in what is presently considered to be a preferred embodiment, other variations and modifications will become apparent to those skilled in the art. It is intended, therefore, that the invention not be limited to the illustrative embodiments, but be interpreted within the full spirit and scope of the appended claims.

I claim:

1. A digital filter for processing a plurality "n" of independent input signals having a common sampling frequency $f_i$ to produce a like plurality "n" of independent output signals, comprising:

input switching means for selecting one of a first plurality "n" of input signals to provide a filter input signal;

a second plurality "m" of serially-connected delay stages including at least a first delay stage and a last delay stage, each delay stage having an input and an output, the output of each delay stage except the last delay stage connected to the input of a subsequent delay stage, and the filter input signal providing the input to the first delay stage;

each delay stage further comprising a plurality "n", equal to the first plurality, of delay elements arranged in a serially-connected array and comprising at least a first delay element and a last delay element, each delay element introducing a unit time delay "T"=$1/(f_i \times n)$ in each of said delay elements;

means for multiplying a third plurality "m+1", one greater than the second plurality "m", of tap signals by a like third plurality of respective coefficients to produce a like third plurality of scaled tap signals, each tap signal except a first tap signal being provided by a corresponding delay stage output, and the filter input signal providing the first tap signal;

summing means for adding all of the tap signals to provide a filter output signal;

output switching means for connected to the summing means for directing the filter output signal to any one of a plurality "n", equal to the first plurality, of output lines; and, means for synchronizing the input switching means to the output switching means.

2. A digital filter according to claim 1, wherein:

the delay elements are all commonly clocked by a clock signal; and the input switching means and output switching means are operated to sequentially step through selection of the input signals and output signals, respectively, one step per cycle of the clock signal.

3. A digital filter according to claim 2, wherein: the first plurality "n" is two.

4. A digital filter for processing a plurality "n" of independent input signals having a common sampling frequency $f_i$ to produce a like plurality "n" of independent output signals, comprising:

input switching means for selecting one of a first plurality "n" of input signals to provide a filer input signal;

a second plurality "m" of summing means, including at least a first summing means and a last summing means, each summing means accepting a first input and a second input and producing a sum output;

means for multiplying the filter input signal by a third plurality "m+1" of coefficients to produce a like third plurality of scaled tap signals, each tap signal except a first tap signal providing the first input of a respective summing means;

a second plurality "m" of delay stages including at least a first delay stage and a last delay stage, each delay stage having an input and an output and arranged such that the input of the first delay stage is provided by the first tap signal, the output of each delay stage provides the second input of a respective summing means;

each delay stage further comprising a plurality "n", equal to the first plurality, of delay elements arranged in a serially-connected array and comprising at least a first delay element and a last delay element, and each delay element introducing a unit time delay "T" which is a multiple of $1/(f_i \times n)$ in each of said delay elements;

the output of each summing means except the last summing means providing the input to a delay stage other than the delay stage which provides its second input, such that the input of each delay stage other than the first delay stage is provided by one summing means;

output switching means connected to the last summing means for directing a filter output signal to any one of a plurality "n", equal to the first plurality, of output lines; and, means for synchronizing the input switching means to the output switching means.

5. A digital filter according to claim 4, wherein:

the delay elements are all commonly clocked by a clock signal; and the input switching means and output switching means are operated to sequentially step through selection of the input signals and output signals, respectively, one step per cycle of the clock signal.

6. A digital filter according to claim 5, wherein: the first plurality "n" is two.

7. A digital filter, according to claim 4, wherein:

the output signals have a sampling frequency $f_o$ different from the input signal sampling frequency;

a ratio $f_i$:$f_o$ is an integral ratio p:q, wherein p and q are relatively prime; and the delay time "T"=$1/(f_{io} \times n)$, where $f_{io} \times n$ is the least common multiple frequency $f_{io}$ (=$f_i \times q = f_o \times p$) between the input signal sampling frequency $f_i$ and the output signal sampling frequency $f_o$.

* * * * *